(12) United States Patent
Lablans

(10) Patent No.: US 9,203,438 B2
(45) Date of Patent: Dec. 1, 2015

(54) ERROR CORRECTION BY SYMBOL RECONSTRUCTION IN BINARY AND MULTI-VALUED CYCLIC CODES

(75) Inventor: Peter Lablans, Morris Township, NJ (US)

(73) Assignee: Ternarylogic LLC, Morristown, NJ (US)

( * ) Notice: Subject to any disclaimer, the term of this patent is extended or adjusted under 35 U.S.C. 154(b) by 1774 days.

(21) Appl. No.: 11/739,189

(22) Filed: Apr. 24, 2007

(65) Prior Publication Data

US 2008/0016431 A1    Jan. 17, 2008

Related U.S. Application Data

(60) Provisional application No. 60/807,087, filed on Jul. 12, 2006.

(51) Int. Cl.
| | |
|---|---|
| H03M 13/00 | (2006.01) |
| H03M 13/15 | (2006.01) |
| H03M 13/09 | (2006.01) |
| H03M 13/37 | (2006.01) |

(52) U.S. Cl.
CPC ............ *H03M 13/158* (2013.01); *H03M 13/09* (2013.01); *H03M 13/15* (2013.01); *H03M 13/152* (2013.01); *H03M 13/1515* (2013.01); *H03M 13/1575* (2013.01); *H03M 13/3776* (2013.01)

(58) Field of Classification Search
CPC  H03M 13/158; H03M 13/1575; H03M 13/15
USPC ........................................................ 714/781
See application file for complete search history.

(56) References Cited

U.S. PATENT DOCUMENTS

| | | | |
|---|---|---|---|
| 4,304,962 A | | 12/1981 | Fracassi et al. |
| 4,320,510 A | | 3/1982 | Kojima |
| 4,455,655 A | * | 6/1984 | Galen et al. .................... 714/758 |
| 4,649,541 A | * | 3/1987 | Lahmeyer ...................... 714/784 |
| 4,763,331 A | * | 8/1988 | Matsumoto .................... 714/759 |
| 4,821,268 A | * | 4/1989 | Berlekamp .................... 714/784 |

(Continued)

OTHER PUBLICATIONS

Stephen B. Wicker, Error Control for Digital Communication and Storage, Prentice-Hall 1995; pp. 99-121.*

(Continued)

*Primary Examiner* — Joseph D Torres

(57) ABSTRACT

Methods, apparatus and systems for error correction of n-valued symbols in codewords of p n-valued symbols with n>2 and for n=2 and k information symbols have been disclosed. Coders and decoders using a Linear Feedback Shift Registers (LFSR) are applied to generate codewords and detect the presence of errors. An LFSR can be in Fibonacci or Galois configuration. Errors can be corrected by execution of an n-valued expression in a deterministic non-iterative way. Deterministic error correction methods based on known symbols in error are provided. Corrected codewords can be identified by comparison with received codewords in error. N-valued LFSR based pseudo-noise generators and methods to determine if an LFSR is appropriate for generating error correcting codes are also disclosed. Methods and apparatus applying error free assumed windows and error assumed windows are disclosed. Systems using the error correcting methods, including communication systems and data storage systems are also provided.

14 Claims, 5 Drawing Sheets

(56) References Cited

U.S. PATENT DOCUMENTS

| | | | |
|---|---|---|---|
| 4,979,173 | A | 12/1990 | Geldman et al. |
| 5,280,488 | A | 1/1994 | Glover et al. |
| 5,297,153 | A | 3/1994 | Baggen et al. |
| 5,343,481 | A | 8/1994 | Kraft |
| 5,414,719 | A * | 5/1995 | Iwaki et al. ............ 714/785 |
| 5,430,739 | A * | 7/1995 | Wei et al. .............. 714/784 |
| 5,440,570 | A | 8/1995 | Wei et al. |
| 5,659,557 | A * | 8/1997 | Glover et al. ........... 714/752 |
| 5,659,578 | A | 8/1997 | Alamouti et al. |
| 5,680,340 | A | 10/1997 | Glover et al. |
| 5,729,559 | A | 3/1998 | Bright et al. |
| 5,875,200 | A | 2/1999 | Glover et al. |
| 5,914,969 | A | 6/1999 | Yabuno et al. |
| 5,925,144 | A | 7/1999 | Sebaa |
| 5,991,454 | A * | 11/1999 | Fowler ................. 382/251 |
| 5,991,911 | A | 11/1999 | Zook |
| 5,996,105 | A | 11/1999 | Zook |
| 6,029,264 | A * | 2/2000 | Kobayashi et al. ....... 714/755 |
| 6,052,815 | A | 4/2000 | Zook |
| 6,070,074 | A * | 5/2000 | Perahia et al. .......... 455/430 |
| 6,285,774 | B1 * | 9/2001 | Schumann et al. ........ 382/100 |
| 6,347,389 | B1 | 2/2002 | Boyer |
| 6,400,728 | B1 * | 6/2002 | Ott .................... 370/465 |
| 6,539,516 | B2 | 3/2003 | Cameron |
| 6,567,017 | B2 * | 5/2003 | Medlock et al. ......... 341/50 |
| 6,634,007 | B1 * | 10/2003 | Koetter et al. ......... 714/784 |
| 6,665,831 | B1 * | 12/2003 | Yoshida et al. ......... 714/774 |
| 6,732,325 | B1 * | 5/2004 | Tash et al. ............ 714/785 |
| 6,757,323 | B1 * | 6/2004 | Fleming et al. ......... 375/142 |
| 6,947,468 | B2 * | 9/2005 | Medlock ................ 375/130 |
| 7,054,386 | B1 * | 5/2006 | Kosmach et al. ......... 375/316 |
| 7,069,496 | B2 * | 6/2006 | Fujita et al. .......... 714/780 |
| 7,089,464 | B2 * | 8/2006 | Herley et al. .......... 714/712 |
| 7,185,259 | B2 * | 2/2007 | Fujita et al. .......... 714/755 |
| 7,203,893 | B2 * | 4/2007 | Kerr et al. ............ 714/780 |
| 7,206,992 | B2 | 4/2007 | Xin |

OTHER PUBLICATIONS

K. R. Matthews, Elementary Linear Algebra, Department of Mathematics, University of Queensland, Second Online Version, Dec. 1998.*

Hank Wallace, Error Detection and Correction Using the BCH Code, 2001, available from the Internet at www.aqdi.com/bch.pdf.

Bernard Sklar, Reed-Solomon Codes, available from the Internet at: http://www.informit.com/content/images/art_sklar7_reed-solomon/elementLinks/art_sklar7_reed-solomon.pdf.

Final Office Action in U.S. Appl. No. 11/775,963, dated Oct. 14, 2011, 11 pgs.

Non-Final Office Action in U.S. Appl. No. 13/103,309, dated Nov. 15, 2011, 16 pgs.

* cited by examiner

ERROR CORRECTION BY SYMBOL RECONSTRUCTION IN BINARY AND MULTI-VALUED CYCLIC CODES

CROSS-REFERENCE TO RELATED APPLICATIONS

This application claims the benefit of U.S. Provisional Application No. 60/807,087, filed Jul. 12, 2006, which is incorporated herein by reference in its entirety.

BACKGROUND OF THE INVENTION

The present invention relates to error correcting coding and decoding. More specifically it relates to generating error correcting cyclic codes and error correcting decoding methods.

Error correction of digital codes is widely used in telecommunications and in transfer of information such as reading of data from storage media such as optical disks. Detection of errors can take place by analyzing symbols that were added to the information symbols during coding. The relation between information symbols and the added coding symbols is determined by a rule. If after reception of the symbols such relation between the symbols as provided by the rule no longer holds, it can be determined that some of the symbols are different or in error compared to the original symbols. Such a relationship may be a parity rule or a syndrome relationship. If the errors do not exceed a certain number within a defined number of symbols it is possible to identify and correct these errors. Known methods of creating error correcting codes and correction of errors are provided by BCH codes and the related Reed-Solomon (RS) codes. These codes are known to be cyclic codes. Error-correction in RS-codes usually involves calculations to determine the location and the magnitude of the error. These calculations in RS-codes can be time and/or resource consuming and may add to a coding latency.

Accordingly methods that can generate and decode cyclic error correcting codes in a faster or easier way are required.

SUMMARY OF THE INVENTION

One aspect of the present invention presents a novel method and apparatus that can rapidly detect and correct errors in codewords with an information rate grater than ½.

It is another aspect of the present invention to provide a method for coding a word of k n-valued information symbols into a codeword of p n-valued symbols.

It is a further aspect of the present invention to provide coding and error correcting decoding methods that can be applied for codewords of binary and for codewords of non-binary symbols.

It is a further aspect of the present invention to provide a method wherein the codewords are selected from sequence of a plurality of n-valued symbols generated by a Linear Feedback Shift Register (LFSR).

It is another aspect of the present invention to provide a method to create a plurality of codewords of p symbols wherein each codeword has at most k symbols in k positions in common with k symbols in k like positions in any other codeword from the plurality.

It is a further aspect of the present invention to provide a method for creating a corrected codeword from a changed codeword of k+2*t+1 n-valued symbols, wherein the changed codeword is created from a first codeword wherein up to t of its symbols may have changed.

It is another aspect of the present invention to provide methods to create equations that establish relations between symbols in a codeword.

It is a further aspect of the present invention to determine a calculated codeword by executing in a non-iterative fashion an n-valued logic expression.

It is a further aspect of the present invention to provide a method to determine if a calculated codeword is an appropriately corrected codeword.

It is another aspect of the present invention to determine a correct codeword when the location of errors in a codeword is known for non-binary symbols.

It is another aspect of the present invention to provide apparatus and systems that will implement the methods provided in the present invention.

DESCRIPTION OF A PREFERRED EMBODIMENT

Figure 1:
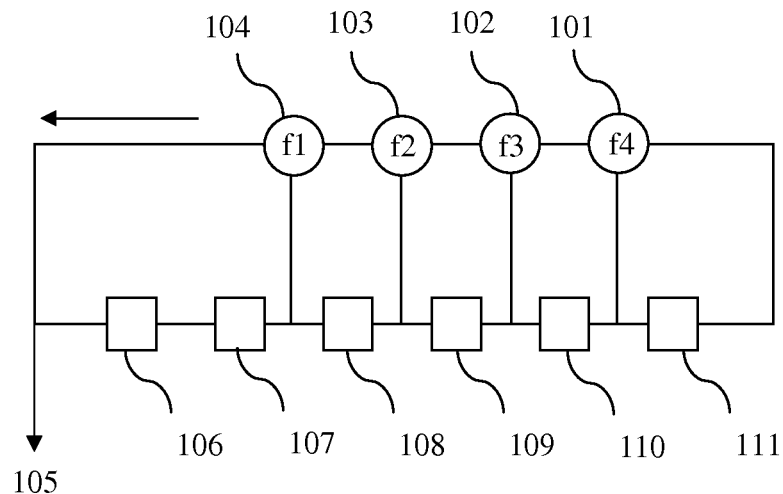
FIG. 1 is a diagram of an LFSR based sequence generator having no multipliers.

One aspect of the present invention is based on the cyclic nature of potential error correcting codes. If a code is created in a cyclic way it is known what piece of code either precedes or succeeds a current codeword. Based on assumptions or hypotheses of occurrence of errors it is possible to reconstruct known preceding or succeeding parts of a codeword and determine if a received codeword containing a body and a preceding and/or succeeding piece of code are statistically significant similar to an error-free version of such a codeword. If such a codeword with errors is significantly close enough to an error free codeword one may then decide that the codeword that is close is actually the error-free codeword.

Correlation type comparison can be used to determine the measure of similarity between two codewords. Multi-valued correlation provides better discrimination between codewords. Binary codewords in the present invention may thus be treated as representing non-binary symbols.

The present invention is related to Reed-Solomon (RS) codes. However there are significant differences. An RS-code for instance requires one symbol less to reach the same error correcting capacity than the method that will be presented here. However a multi-valued RS-code requires more complex calculations for its error-correcting process and requires the length of the codeword to be smaller than the potential number of states of a symbol. Further more the present invention can be simplified for assumptions on error-occurrence.

RS-codes are cyclic codes. The code is comprised of a plurality of codewords; each codeword is comprised of a plurality of symbols. The symbols in general are n-valued, but are coded in binary symbols. Alternatively binary signals may be divided into series of binary words, wherein each binary word is comprised of more than 1 bit. A binary sequence may then be interpreted as representing a word comprised of a plurality of n-valued symbols.

Assume an RS-codeword to be comprised of p n-valued information symbols. In addition to the information symbols a plurality of coding symbols is added to the codeword derived from the information symbols. The additional symbols may be calculated as being the remainder of a polynomial division. The symbols of the remainder of the division are added to the codeword, thus completing the codeword for transmission. In order for each remainder to be unique to the word comprised of the information symbols all symbols are represented in a Galois Field and the division is also executed in the Galois Field. In general (because of the preference to code the n-valued symbols in a binary fashion) one would like to execute the division in what is known in the art as an extended Galois Field which in general is constructed as an extended binary field $GF(2^p)$.

Because of the nature of the Galois Field and its possibility to express relationships, sequences and arithmetical operations between symbols as polynomials over GF, shift register solutions can be used for the coding process. This is described in books such as: Error Control Coding, $2^{nd}$ edition, by Shu Lin and Daniel J. Costello Jr.; Pearson Prentice Hall 2004.

The theory of Galois Field arithmetic is known to persons skilled in the art and does not need further explanation here. The codes are usually identified as (n,k) wherein n is the total number of multi-valued symbols in a word and k is the number of information symbols. In the present invention the letter n will be used for the radix or value of a logic. The letter p will be used to indicate the total number of symbols in a codeword. There are k information symbols in a (p,k) code. Consequently there are (p–k) symbols that can be used to detect and/or correct errors. In essence the remainder that is attached to a codeword is an extension of the word formed by the information symbols so that the new word has an increased distance to all other valid codewords.

The advantage of the BCH codes and the RS codes is that one can correct the errors that have occurred in a limited number of symbols in a codeword, no matter where the errors have occurred. Correcting the errors in RS codes is a quasi-deterministic process. It may involve a significant number of iterative calculations as one is trying to find code solutions for which a calculated syndrome is 0.

The present invention in one aspect applies the cyclic nature of the creation of codewords and, because of the way how codewords are created, it leverages the unique way that additional symbols can be attached to information symbols to form a codeword. In another aspect it also applies the concatenated aspect of pseudo-noise sequences, in the sense that in a pseudo-noise sequence each "word" of a minimal size occurs exactly once.

Cyclic codes are generally block codes, wherein a series of symbols are combined into a unit of fixed length of symbols. A block may be generated as a sequence of symbols. A sequence or a word usually generated by an LFSR based coder, after a certain number of blocks, may be provided again by the LFSR based coder. Because a message of p n-valued symbols can have $n^p$ possible combinations or words, the total cyclic block should contain also $n^p$ different words of p n-valued symbols. It is possible to form words from consecutive p n-valued symbols in certain sequences so that each word is unique. The sequences where this is possible are called pseudo-noise sequences.

One way to create n-valued pseudo-noise sequences is by way of Linear Feedback Shift Register (LFSR) methods. There are two ways to apply LFSRs: the Fibonacci and the Galois method. In essence Galois and Fibonacci configurations of Shift Register circuits for n-valued logic (n≥2) are equivalent. They are equivalent, but not identical and there are some differences that have to be taken into account. However, as shown by the inventor in U.S. patent application Ser. No. 11/696,261 filed: Apr. 4, 2007 entitled: BINARY AND N-VALUED LFSR AND LFCSR BASED SCRAMBLERS, DESCRAMBLERS, SEQUENCE GENERATORS AND DETECTORS IN GALOIS CONFIGURATION and incorporated herein by reference in its entirety, the differences are small enough that one can maintain that sequences generated by Fibonacci generators can also be generated by Galois configurations. Those configurations in general have a forbidden (degenerate) state of the shift register. However the degenerate states may not be a problem as they also form a codeword.

The inventor has also shown methods (called "word-methods") that can be applied to generate a full $n^p$ sequence instead of an $n^{p-1}$ sequence with the shift register based methods. The word-method is advantageous because one does not have to consider 'forbidden' words. One can create words in an order that can not be achieved with an LFSR. This is described in U.S. Provisional Patent Application entitled: The Creation And Detection Of Binary And Non-Binary Pseudo-Noise Sequences Not Using LFSR Circuits; Ser. No. 60/695,317 filed on Jun. 30, 2005 and in U.S. Non-provisional patent application entitled: The Creation And Detection Of Binary And Non-Binary Pseudo-Noise Sequences Not Using LFSR Circuits; Ser. No. 11/427,498, filed on Jun. 29, 2006, both of which are incorporated herein by reference.

Shift register methods are advantageous because they can generate sequences without having to store them. They require the availability of a starting position for the initial values of the shift register.

An important requirement for successful error-correcting of coded words is that each word can be uniquely determined. This means that sufficient symbols have to be added in such a way that each received word has an optimal "code distance" to its correct and error-free equivalent. Codewords should be designed to address a certain expected occurrence of errors. If a channel generates more errors than the error-correcting capacity of the code, correct identification of the codeword may no longer possible. In traditional deterministic error correcting coding theory for block codes it is accepted that 2*t+1 extra symbols may correct up to t symbol errors. This does not tell how these symbols need to be selected and positioned.

For reasons of illustrative purposes symbols are added to a codeword after the last symbol. So a codeword [c1 c2 c3 c4] comprised of 4 symbols can be changed to [c1 c2 c3 c4 s1 s2 s3] by adding additional symbols [s1 s2 s3]. How the additional code symbols are selected and how they are positioned into the codeword may vary. Different schemes are possible, contemplated and methods hereto will be described later.

For binary symbols the code distance between symbols in one position can at most be 1. A binary symbol thus only has one symbol that can be different from itself. If a binary symbol is 0, its different counterpart is 1; and when a binary symbol is 1 its counterpart is 0. In ternary symbols the symbol can for instance be 0, 1 or 2, so each symbol has two different counterparts; and in 4-valued coding a symbol can be 0, 1, 2 or 3. So in 4-valued coding there are 4 different codewords that can be described as [0 0 0 x], with x being either 0, 1, 2 or 3. In binary coding there are only 2 different codewords [0 0 0 x]. This aspect is helpful to maintain a certain distance between codewords without having to increase the number of symbols in a codeword.

Standard binary LFSR based scramblers, descramblers and sequence generators are generally provided in Fibonacci form. It should be noted that Galois based configurations for generating PN sequences are known and contemplated. Methods for this have been described in previously cited U.S. patent application Ser. No. 11/696,261.

For the purpose of simplicity the descriptions in this disclosure will be limited to Fibonacci configurations. However the use of Galois configurations is fully contemplated. One skilled in the art will be familiar with the use of Galois configuration based RS coders. For instance in an article by Bernard Sklar, entitled Reed Solomon codes, which is available on-line at: http://www.informit.com/content/images/art_sklar7_reed-solomon/elementLinks/art_sklar7_reed-solomon.pdf; a Galois configuration 8-valued (7,3) RS-coder is provided in FIG. 9 in that article.

A 7-VALUED EXAMPLE

For developing the coding and decoding method the performance of an RS-code will be used as a comparison. There are several conditions for a valid RS-code. The distance between a codeword with the maximum number of errors t and the error-free codeword has to be 2*t+1. However this can be achieved by adding just 2*t extra symbols to a codeword. This is slightly better than what will be used as an aspect of the present invention. However the number of n-valued symbols has to be smaller than n to achieve that advantage. In general it forces an RS decoder to be more complex than sometimes necessary.

Present practices usually apply RS-coding and decoding in such a way that each symbol is coded as a binary word. If one transmits a binary sequence it will be unlikely that only the length of one n-valued coded symbol will experience an error. Even if the probability of errors predicts that such an error will only affect the length of a single n-valued symbol. Most likely an error of several bits will affect partly one symbol and partly the next adjacent symbol. Though an error may at most affect a consecutive number of bits representing a single n-valued symbol, in practice this may create errors in two adjacent n-valued symbols. An effective code should thus be able to correct two adjacent errors.

Hamming codes are known. And by interleaving two Hamming coded words one may create an effective code for error-correction of 2 errors. However the information transmission rates of such codes is around ½, because its overhead is close to its payload.

Based on the above conditions the first code that will have a performance of interest here with an ability to correct up to 2 errors is an 7-valued error-correcting code with a codeword of 6 symbols. To be able to correct 2 errors on a Hamming distance one would need 5 overhead symbols. In an RS code one would need 4 overhead symbols. Assuming that all overhead words would be different and each 5 symbol word differs at least in 1 symbol. The current error correcting code (because the number of symbols is greater that the value of the logic) does not have that advantage. Accordingly one needs an additional overhead symbol to ensure that each codeword of 11 7-valued symbols differs in at least 5 symbols from any other codeword in the set. Accordingly this creates a codewords of 11 symbols. The information rate with this is 6/11 and thus is better than ½. With a 16 valued coded symbol one could create an effective world length of 15 symbols and with 5 overhead symbols and thus with an information rate of 15/20.

For illustrative purposes the here provided explanation will use a 7-valued code of 6 symbols and 5 overhead symbols. It will demonstrate that it is possible to generate a code with an information transmission rate better than 0.5. However, like known RS methods, the here presented invention is capable of creating n-valued codewords of length p and of decoding k errors within the previously discussed conditions. One coding example will be provided later using an 8-valued coding method, by applying an extended binary Galois Field over $GF(2^3)$. The present invention describes several aspects: the coding, the decoding and the error correction.

The Coding

The coding process, using 7-valued symbols, should be such that any 6 symbol combination will be coded into an 11 symbol 7-valued codeword. The coding will be performed by an LFSR based coding method. For illustrative purposes the Fibonacci configuration of an LFSR will be used. The use of Galois configurations is also possible and is fully contemplated.

A diagram for the Fibonacci LFSR coder is shown in FIG. 1. It is comprised of a 6-element shift register with elements 106, 107, 108, 109, 110 and 111, of which each element can store a 7-valued element. (In practice each element may store a binary representation of a 7-valued symbol). Not shown, but assumed is a clock signal. Each shift register element has an input and an output. Each output of an element (except for the last one) is connected to the input of the next one (on its right). Of some elements and at least of the last one the output is connected to a 7-valued reversible logic function via a feedback tap. On the occurrence of a clock pulse the content of the storage element is shifted 1 position to the right. As an illustrative example the LFSR of FIG. 1 is shown in a configuration with devices 101, 102, 103 and 104. Device 101 implements a 7-valued logic function f4, device 103 implements a 7-valued logic function f2, device 102 implements a 7-valued logic function f3 and device 101 implements a 7-valued logic function f4. The output of the device 104 implementing function 'f1' is made available on 105 and shifted into element 106. Known art uses adders and multipliers. The inventor has created solutions using single reversible logic functions without multipliers. The methods how to substitute n-valued adders with multipliers by n-valued functions was shown in U.S. patent application entitled: Ternary and Multi-Value Digital Scramblers, Descramblers And Sequence Generators; Ser. No. 10/935,960 filed on Sep. 8, 2004, which is incorporated herein by reference in its entirety. All devices implementing a logic function in the Fibonacci and Galois configurations as shown in FIG. 1 will implement n-valued reversible functions.

By initializing the content of the shift register with the to be coded 6 7-valued symbols and running the LFSR for 5 clock pulses one then has generated an 11 symbol 7-valued word comprising the initial word and the added 5 symbols generated by the LFSR. A pseudo-noise sequence created by an LFSR of length of k elements generally has a length of $n^k-1$ symbols. Accordingly the 7-valued LFSR with 6 elements of FIG. 1 can potentially generate a unique sequence of 117648 7-valued symbols. More specifically a pn-sequence generated by an n-valued LFSR of k elements can also be created from $(n^k-1)$ different overlapping words created from k n-valued symbols. This requires that the sequence is extended with the first (k-1) symbols of the sequence. The only word that is missing is the forbidden word, which depends on the selected n-valued functions in the LFSR. Except for the forbidden word one may say that any combination of k n-valued symbols is part of such a sequence.

Consequently almost every word that is to be coded into a codeword (except the forbidden word) is in the sequence. One can actually create a sequence that also includes the forbidden word, by applying the 'word-method' which was invented by the inventor and described in the earlier cited Patent Application 60/695,317 and Ser. No. 11/427,498.

One can create the 11-symbols word by initiating the LFSR sequence generator with the 6-symbol word that needs to be transmitted and let the LFSR run for an additional 5 clock pulses to complete the 11 symbols codeword. One can then transmit the 11 symbol word. At the receiving side an LFSR identical to the coder is initiated with the first 6 symbols of the received codeword. The LFSR at the receiving side is run for 5 clock pulses. One should compare the thus created 11 symbol word with the received codeword. If both words are identical, then one may assume that the transmission was error free under the assumption of an upper bound of the symbol error ratio of the channel.

This process is known in binary applications as Cyclic Redundancy Check or CRC. It is one aspect of the present invention to create an n-valued CRC error detection method. By selecting an n-valued LFSR with k elements that can add p-k consecutive symbols and form codewords comprising the original word [a1 ... ak] and add [bm ... bp] to form the codeword [a1 ... ak bm ... bp] in such a way that each codeword has at most k symbols in common one can detect that the codeword is in error when up to $(p-k)-\frac{1}{2}$ errors are present.

It is another aspect of the present invention to create an n-valued error correcting code that can correct at least two errors with an information rate that is greater than ½. One problem with an unstructured n-valued LFSR coder is that the additional 5 symbols (in the illustrative example) may not differentiate a first codeword of 11 n-valued symbols sufficiently from another 11-symbol codeword generated by the same coder. This will be illustrated with the following example.

| b5  | b4  | b3 | b2 | b1 | a6 | a5 | a4 | a3 | a2 | a1 |
|-----|-----|----|----|----|----|----|----|----|----|----|
| c11 | c10 | c9 | c8 | c7 | c6 | c5 | c4 | c3 | c2 | c1 |
| d11 | d10 | d9 | d8 | d7 | d6 | d5 | d4 | d3 | d2 | d1 |

Assume that with the LFSR an 11-symbol sequence was generated with 6 information symbols [a6 a5 a4 a3 a2 a1] and 5 overhead symbols [b5 b4 b3 b2 b1]. It is assumed that word synchronization can be maintained. One could then check if the correct sequence was received (assuming one knows which one was sent), by comparing the word [b5 b4 b3 b2 b1 a6 a5 a4 a3 a2 a1] with the received word. A simple correlation scheme can be used by adding a 1 to a sum when corresponding symbols are identical. The sum is reset after each word. So when there is a complete match the correlation sum will be 11. If there is a match, but with errors in the received word, the sum will be smaller than 11. For instance, if there is one error in the received word the sum will be 10 in a comparison with the correct word. If there are 2 errors the sum will be 9 in a comparison, etc.

Of course the nature of symbol transmission is that it is not known which sequence was sent. One way to detect the correct word is to compare the received word with all possible words in a pn-sequence. This may be time-consuming, but it certainly can be done. If there are no errors then the match that shows 11 will be the correct word. This is possible because each word of k symbols in a k-element LFSR generated pn-sequence will occur only once. By the nature of this rule each word in such a sequence will have at least a distance 1 (or will differ in at least one symbol). In the creation of a codeword for the illustrative example 5 additional symbols are added to the 6 information symbols. One would want a code distance of 5 to correct 2 errors. By adding 5 symbols, each codeword of 11 symbols should preferably differ in at minimum 5 symbols. This would be sufficient to differentiate between all words when a maximum of 2 errors can occur. Assume the difference between word1=[b5 b4 b3 b2 b1 a6 a5 a4 a3 a2 a1] and word2=[c11 c10 c9 c8 c7 c6 c5 c4 c3 c2 c1] is 5 symbols. Comparing word1 with word1 (itself) will of course generate a correlation sum of 11. Comparing word1 with word2 will generate a correlation sum of 6. It should be realized that one can only generate such sequence with a selected LFSR that will create the desirable codewords.

Under very special conditions (needed for an RS-code) the difference between each word of p n-valued symbols generated by an LFSR with a shift register of k symbols will be $(p-k)+1$. First of all each content of the LFSR of generating a pseudo-noise sequence is always at least one. In the ideal situation of the RS-code adding (n−k) extra check symbols to a word will be done in such a way that all 'extra words' are added in such a way that n symbols always differ in n−k+1 symbols. In general as was shown (especially when n is smaller than p) this will not be the case. When p>n (or the number of symbols p is greater than the logic level n), adding (n−k) symbols only increases the distance with (n−k−1) usually with an upper bound of (n−1). Accordingly in the not ideal (n<p) situation one has to add al least one more check symbol than in an RS-code to achieve the required distance between codewords.

So in the not ideal situation of the illustrative example of 11 7-valued symbols with 6 information symbols and 5 check symbols and a distance 6 when there are no errors, comparing the received word with all possible words in an extended pn-sequence (the pn sequence plus the first (p−1) symbols) will generate a series of sums 6 and one occurrence of sum 11. The result of sum 11 identifies of course the correct codeword.

When one error has occurred the result will be a series of different numbers of which the highest is 10 and the next highest is not greater than 7, assuming that the worst case will diminish the distance (which was 5). The correct word is determined by the result with the highest sum (10). Only one sum of 10 will occur. With two errors the highest sum is 9, while the other comparisons can not be greater than 8. It should be clear that 3 errors will make it impossible to identify the correct word (without doing additional work) as the sums of the matching word with 3 errors will be 8. In that case, unfortunately the distance with a non-matching word has also diminished and there may (and will) be a series of 8s.

The above reasoning applies to any two errors. One may obtain a better result with error bursts. In that case all errors in a word may be assumed to be adjacent. It should also be clear that the method allows to detect a greater number of errors.

Most LFSR solutions will not create the desired 11 symbol words with a cross-correlation of 6 and an auto-correlation of 11 for each word. The majority of LFSRs will generate words which will have a distance of 4 symbols or cross-correlation of 7. This is not sufficient to correct two errors. One can use several methods to identify the correct LFSR configuration to generate a usable pn-sequence with the desired distance between words. Unfortunately the number of functions that need to be considered is quite large, though one can limit the search to LFSRs based on primitive, irreducible, functions over $GF(n^k)$. An effective method comprises using possible n-valued multipliers or n-valued inverters in combination with radix-n adders and determine if a usable sequence will be generated. A complete 6 element 7-valued LFSR pn-sequence has 117,648 symbols. This makes selection very time consuming.

A preferred method is to first generate a sequence of limited size, and select only those configurations that generate sequences with different words and sufficient code distance for 11 symbol words. For instance in consecutive steps one can evaluate sequences of 1000, 5000, 10,000, 50,000 and 117,648 symbols and drop those configurations that will not meet the requirements.

Assume that the functions connected to the taps are selected and placed in such a way that the selected LFSR will generate a pseudo-noise sequence with the desired properties. One can apply the following steps applied to the illustrative 7-valued example to check if one wants to continue with growing the sequence for analysis. Starting with a sequence of 1000 7-valued symbols:

1. create (1000) overlapping words of 6 symbols. As an illustration the sequence [a b c d e f g h i j k l m n] would generate the following 6 symbol words:

> [a b c d e f];
> [b c d e f g];
> [c d e f g h];
> [d e f g h i];
> [e f g h i j];
> [f g h i j k];
> [g h i j k l];
> [h i j k l m];
> [i j k l m n];

2. check if every word is unique (for instance by transforming every word into a decimal number and sorting the numbers);
3. create overlapping words of 11 symbols:

> [a b c d e f g h i j k];
> [b c d e f g h i j k l];
> [c d e f g h i j k l m];
> [d e f g h i j k l m n];

4. Compare the words and check if the correlation sum is 11 or less than 7.

It should be clear that this approach modified for the code level n and number of symbols works for any LFSR selection.

Sequences (and consequently LFSRs) that do not meet the requirements are dropped. The LFSRs that meet the requirements are then run for longer sequences and checked again.

Figure 2:
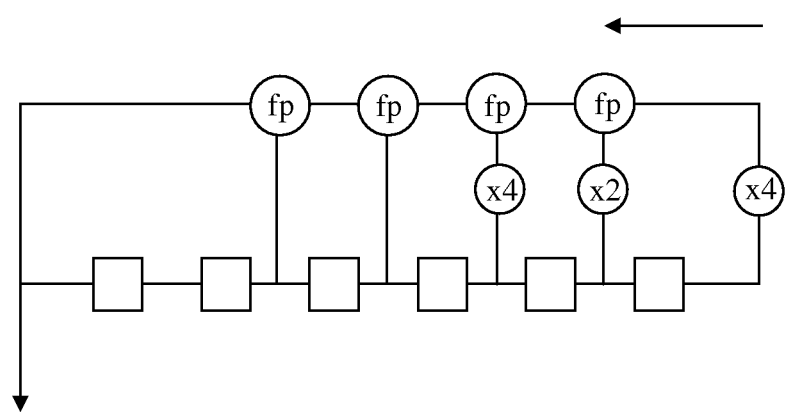
FIG. 2 is a diagram of an LFSR based sequence generator using multipliers.

One LFSR that will generate a sequence that meets the requirements in a configuration of FIG. 1 can be first created by using the configuration of FIG. 2. In that configuration all functions f1, f2, f3 and f4 execute the radix-7 addition and have in their taps a radix-7 multiplier. This will not generate all the possible solutions of the configuration FIG. 1. However it will generate at least one usable configuration. One usable configuration is shown in FIG. 2. Comparing FIG. 1 and FIG. 2 one can conclude that 7-valued function f4 is fp with multipliers 4 and 2 at the inputs. Function f3 can be created from fp and a multiplier 4 at one input and f2 and f1 both are identical to fp. The function fp is the 7-valued addition.

For error correcting purposes it may be important to reduce combination of an n-valued function with one or two n-valued multipliers to a single reversible function. The inventor has shown in earlier cited U.S. patent application Ser. No. 10/935,960 one can achieve such reduction. The resulting 7-valued logic functions are shown in the following truth tables.

| fp | 0 | 1 | 2 | 3 | 4 | 5 | 6 |
|----|---|---|---|---|---|---|---|
| 0  | 0 | 1 | 2 | 3 | 4 | 5 | 6 |
| 1  | 1 | 2 | 3 | 4 | 5 | 6 | 0 |
| 2  | 2 | 3 | 4 | 5 | 6 | 0 | 1 |
| 3  | 3 | 4 | 5 | 6 | 0 | 1 | 2 |
| 4  | 4 | 5 | 6 | 0 | 1 | 2 | 3 |
| 5  | 5 | 6 | 0 | 1 | 2 | 3 | 4 |
| 6  | 6 | 0 | 1 | 2 | 3 | 4 | 5 |

| f4 | 0 | 1 | 2 | 3 | 4 | 5 | 6 |
|----|---|---|---|---|---|---|---|
| 0  | 0 | 4 | 1 | 5 | 2 | 6 | 3 |
| 1  | 2 | 6 | 3 | 0 | 4 | 1 | 5 |
| 2  | 4 | 1 | 5 | 2 | 6 | 3 | 0 |
| 3  | 6 | 3 | 0 | 4 | 1 | 5 | 2 |
| 4  | 1 | 5 | 2 | 6 | 3 | 0 | 4 |
| 5  | 3 | 0 | 4 | 1 | 5 | 2 | 6 |
| 6  | 5 | 2 | 6 | 3 | 0 | 4 | 1 |

| f3 | 0 | 1 | 2 | 3 | 4 | 5 | 6 |
|----|---|---|---|---|---|---|---|
| 0  | 0 | 1 | 2 | 3 | 4 | 5 | 6 |
| 1  | 4 | 5 | 6 | 0 | 1 | 2 | 3 |
| 2  | 1 | 2 | 3 | 4 | 5 | 6 | 0 |
| 3  | 5 | 6 | 0 | 1 | 2 | 3 | 4 |
| 4  | 2 | 3 | 4 | 5 | 6 | 0 | 1 |
| 5  | 6 | 0 | 1 | 2 | 3 | 4 | 5 |
| 6  | 3 | 4 | 5 | 0 | 1 | 2 | 3 |

One should keep in mind that the LFSR of FIG. 2 will have the forbidden word [0 0 0 0 0 0]. However a single 11 symbol word that will have [0 0 0 0 0 0] as its first 6 symbols and at most 6 symbols in common with any other 11 symbol word of the sequence for instance is [0 0 0 0 0 0 0 0 0 0 0]. It is not desirable to have long sequences of identical symbols. One should probably break these sequences up with a scrambler. However in case a word of 6 0s occurs, then one can code this as an exception by for instance 11 0s and comply with the condition that each word has 11 symbols in common with itself and just 6 with any other word of the sequence.

So, at this stage a method has been presented as an aspect of the current invention that applies an n-valued LFSR of k elements that can generate an n-valued word of k+(t*2+1) symbols. Each {k+(t*2+1)} word is part of an extended pseudo-noise sequence of $(n^k-1)+(p-1)$ n-valued symbols and each word has at most k symbols in common with another word. Consequently each word of p={k+(t*2+1)} n-valued symbols may contain maximally t errors which can be corrected. Each word (including the forbidden word) can be generated by an LFSR by using the information word extended by the (t*2+1) symbols created by the LFSR with the k symbol information word as initial content of the LFSR. While this code appears similar to an RS code it actually requires one more symbol than the RS-code, but can handle codewords with p>n.

In the illustrative example all possible words of 6 7-valued symbols can be used to generate 11 symbols codewords by an LFSR wherein each 11 symbols word has at maximum 6 symbols in common with another codeword. A codeword can be generated by initializing the LFSR with the information word that needs to be coded and have the LFSR generate the additional symbols.

Decoding and Error Correcting Decoding

Decoding of the error-free received words is simple. It is assumed that synchronization of the codewords can be maintained. Decoding is then comprised of first taking the first six symbols of the codeword as the initial content of the decoder, which is identical to the LFSR coder. One then runs the LFSR for 5 clock pulses and compares the generated 5 symbols with the last 5 symbols of the received codeword of 11 symbols. If the generated 5 symbols are identical to the received symbols then the received codeword was error-free and the first 6 symbols are the correctly decoded information symbols. Decoding in this case is just separating the 6 information symbols from the 11 symbols codewords.

One can also apply as an aspect of the present invention a more elaborate decoding scheme which comprises the generating of the complete extended sequence and comparing each occurring overlapping word in this extended sequence with the received codeword. When such a comparison generates the number 11 (in the error-free situation) one has detected the correct codeword and one can separate the information symbols from the codeword.

When up to 2 errors have occurred, the first decoding method using the LFSR will generate the incorrect 5 symbols, so it is clear that errors have occurred. By comparing the received codeword with all possible codewords one can again determine what the received word should be. Assuming a maximum of 2 errors, a comparison that will generate a sum of 9 or greater will be the correct word. All other comparisons, assuming two errors as shown before will generate a sum of 8 or less. The only problem is that one may need to conduct a significant number of correlation tests as there are 117,648 possible words in the illustrative example. One possibility is to conduct all comparisons in parallel, at a significant cost of hardware.

Another decoding method, which is an aspect of the present invention, will be presented next. The following error-correcting decoding method applies the reversible nature of the applied functions in the LFSR. Now referring to the LFSR of FIG. 1 with the functions f1, f2, f3 and f4. Assume that the initial content of the shift register is [a6 a5 a4 a3 a2 a1]. This order is selected as all symbols in the drawn configuration move from left to right. The generated symbols that will enter the shift register from the left will arrive in the order [b5 b4 b3 b2 b1]. The presented LFSR is a Fibonacci configuration, although a Galois configuration is also fully contemplated. This means that intermediate results will be generated before the real output signal is achieved. The equations of the next section apply to the generated symbols using t1, t2, and t3 as intermediate results. It should be pointed out that in this configuration only 5 of the 6 elements of the initial states contribute to the output in a step. The functions f2 and f1 are non-commutative and one should take care of the correct order of inputs.

It is assumed that in an equation "c=a fn b" that 'a' represents the row of a truth table. In the diagram of FIG. 2 'a' represents a horizontal connection input to a logic device. Consequently 'a' represents a row in a truth table and 'b' is a vertical input to a function and represents a column in a truth table as drawn in the LFSR of FIG. 1 and FIG. 2. Next the consecutive steps after consecutive clock pulses in the LFSR of FIG. 2 are shown in equations:

Step1 with LFSR Content [a6 a5 a4 a3*a* a2 a1]:

$t1=a2f4a1$ $t2=a3f3t1$ $t3=a4f2t2$ $b1=a5f1t3$

Step2 with LFSR Content [b1 a6 a5 a4 a3*a* a2]:

$t1=a3f4a2$ $t2=a4f3t1$ $t3=a5f2t2$ $b2=a6f1t3$

Step3 with LFSR Content [b2 b1 a6 a5 a4 a3]:

$t1=a4f4a2$ $t2=a5f3t1$ $t3=a6f2t2$ $b3=b1f1t3$ etc.

All applied n-valued logic functions are reversible. In general the here applied functions are not self-reversing and it is necessary to determine the truth tables of the reverse functions. A non-commutative logic function may have two reversible functions: one along the rows and one along the columns of its truth table.

Assume the reversible function f4 to which applies the equation c=a f4 b, in which 'a' represents the row element and 'b' the column element. To make sure there is no ambiguity around this the truth table of the non-commutative 7-valued function f4 is shown in the next truth table.

| c | | | | b | | | |
|---|----|---|---|---|---|---|---|
| | f4 | 0 | 1 | 2 | 3 | 4 | 5 | 6 |
| | 0 | 0 | 4 | 1 | 5 | 2 | 6 | 3 |
| | 1 | 2 | 6 | 3 | 0 | 4 | 1 | 5 |
| a | 2 | 4 | 1 | 5 | 2 | 6 | 3 | 0 |
| | 3 | 6 | 3 | 0 | 4 | 1 | 5 | 2 |
| | 4 | 1 | 5 | 2 | 6 | 3 | 0 | 4 |
| | 5 | 3 | 0 | 4 | 1 | 5 | 2 | 6 |
| | 6 | 5 | 2 | 6 | 3 | 0 | 4 | 1 |

To determine the result of 'c' from the truth table one selects 'a' to be one of the rows, indicated by the numbers in the column under the label 'f4'; the value of 'b' is selected to be in a column determined by the numbers in the row to the right of label 'f4'. One can check the arrangement by determining c=2 f4 3 (which is 2) and c=3 f4 2 (which is 0).

The reverse table f4$rr$ of f4 over the rows of f4 is determined as follows: c=a f4 b a=c f4$rr$ b. One can use a simple computer program to generate the truth table of f4$rr$ given f4. In pseudo code the steps for such a program are:

for all values of a
for all values of b $c=f4(a,b);$ $f4rr(c,b)=a;$ end
end

The truth table of the 7-valued function f4$rr$ is provided in the following truth table.

| c | | | | b | | | |
|---|------|---|---|---|---|---|---|
| | f4rr | 0 | 1 | 2 | 3 | 4 | 5 | 6 |
| | 0 | 0 | 5 | 3 | 1 | 6 | 4 | 2 |
| | 1 | 4 | 2 | 0 | 5 | 3 | 1 | 6 |
| a | 2 | 1 | 6 | 4 | 2 | 0 | 5 | 3 |
| | 3 | 5 | 3 | 1 | 6 | 4 | 2 | 0 |
| | 4 | 2 | 0 | 5 | 3 | 1 | 6 | 4 |
| | 5 | 6 | 4 | 2 | 0 | 5 | 3 | 1 |
| | 6 | 3 | 1 | 6 | 4 | 2 | 0 | 5 |

For the reverse function over the columns one then has to apply:

for all values of a
for all values of b $c = f4(a,b);$ $f4rc(a,c) = b;$ end
end

The truth table of f4rc is shown in the following truth table.

| c<br>f4rc | | 0 | 1 | 2 | b<br>3 | 4 | 5 | 6 |
|---|---|---|---|---|---|---|---|---|
| | 0 | 0 | 2 | 4 | 6 | 1 | 3 | 5 |
| | 1 | 3 | 5 | 0 | 2 | 4 | 6 | 1 |
| a | 2 | 6 | 1 | 3 | 5 | 0 | 2 | 4 |
| | 3 | 2 | 4 | 6 | 1 | 3 | 5 | 0 |
| | 4 | 5 | 0 | 2 | 4 | 6 | 1 | 3 |
| | 5 | 1 | 3 | 5 | 0 | 2 | 4 | 6 |
| | 6 | 4 | 6 | 1 | 3 | 5 | 0 | 2 |

Applying the reversing method one can then also easily create the inverse of f3 over the columns 'f3rc' and the inverse of function f3 over the rows 'f3rr'. The resulting truth tables are provided in the following tables.

| c<br>f3rc | | 0 | 1 | 2 | b<br>3 | 4 | 5 | 6 |
|---|---|---|---|---|---|---|---|---|
| | 0 | 0 | 1 | 2 | 3 | 4 | 5 | 6 |
| | 1 | 3 | 4 | 5 | 6 | 0 | 1 | 2 |
| a | 2 | 6 | 0 | 1 | 2 | 3 | 4 | 5 |
| | 3 | 2 | 3 | 4 | 5 | 6 | 0 | 1 |
| | 4 | 5 | 6 | 0 | 1 | 2 | 3 | 4 |
| | 5 | 1 | 2 | 3 | 4 | 5 | 6 | 0 |
| | 6 | 4 | 5 | 6 | 0 | 1 | 2 | 3 |

| c<br>f3rr | | 0 | 1 | 2 | b<br>3 | 4 | 5 | 6 |
|---|---|---|---|---|---|---|---|---|
| | 0 | 0 | 5 | 3 | 1 | 6 | 4 | 2 |
| | 1 | 2 | 0 | 5 | 3 | 1 | 6 | 4 |
| a | 2 | 4 | 2 | 0 | 5 | 3 | 1 | 6 |
| | 3 | 6 | 4 | 2 | 0 | 5 | 3 | 1 |
| | 4 | 1 | 6 | 4 | 2 | 0 | 5 | 3 |
| | 5 | 3 | 1 | 6 | 4 | 2 | 0 | 5 |
| | 6 | 5 | 3 | 1 | 6 | 4 | 2 | 0 |

The following example will show how to correct 2 consecutive errors in a received word of 11 7-valued symbols. The method can be applied to any number of errors as long as the distance between the words is sufficient, which means of course that the codeword has sufficient additional symbols. The reason to use two consecutive errors as an illustrative example is to demonstrate how the method works for correcting more than 1 error. Consecutive errors are used as an example to limit the number of equations to illustrate the methods. However this is done only for illustrative purposes. One can apply the method also for non-consecutive errors, wherein the errors can occur anywhere in the codeword.

The following table shows the different ways that 2 consecutive errors could have occurred in a word of 11 symbols. An error is indicated as e.

| possible<br>error word | | | | | | | | | | | |
|---|---|---|---|---|---|---|---|---|---|---|---|
| 1. | b5 | b4 | b3 | b2 | b1 | a6 | a5 | a4 | a3 | e1 | e2 |
| 2. | b5 | b4 | b3 | b2 | b1 | a6 | a5 | a4 | e1 | e2 | a1 |
| 3. | b5 | b4 | b3 | b2 | b1 | a6 | a5 | e1 | e2 | a2 | a1 |
| 4. | b5 | b4 | b3 | b2 | b1 | a6 | e1 | e2 | a3 | a2 | a1 |
| 5. | b5 | b4 | b3 | b2 | b1 | e1 | e2 | a4 | a3 | a2 | a1 |
| 6. | b5 | b4 | b3 | b2 | e1 | e2 | a5 | a4 | a3 | a2 | a1 |
| 7. | b5 | b4 | b3 | e1 | e2 | a6 | a5 | a4 | a3 | a2 | a1 |
| 8. | b5 | b4 | e1 | e2 | b1 | a6 | a5 | a4 | a3 | a2 | a1 |
| 9. | b5 | e1 | e2 | b2 | b1 | a6 | a5 | a4 | a3 | a2 | a1 |
| 10. | e1 | e2 | b3 | b2 | b1 | a6 | a5 | a4 | a3 | a2 | a1 |

The fundamental idea for error correction is that only 6 correct symbols in the example are required to reconstruct a codeword and that the distance between a reconstructed codeword and a received codeword is not more than 2 in this example. The design of the codewords already assures that the second condition is met. The first step in error correcting decoding assumes that symbols a2 and a1 are in error. One thus needs to create an equation with one unknown symbol that then can be resolved and do this for both errors e1 and e2, using the configuration of FIG. 1 with f1=f2=fp; f2 and f4 as earlier provided.

For the purpose of decoding the reverse of function fp over the columns (fprc) and over the rows (fprr) will be needed. Both truth tables are provided next.

| c<br>fprc | | 0 | 1 | 2 | b<br>3 | 4 | 5 | 6 |
|---|---|---|---|---|---|---|---|---|
| | 0 | 0 | 1 | 2 | 3 | 4 | 5 | 6 |
| | 1 | 6 | 0 | 1 | 2 | 3 | 4 | 5 |
| a | 2 | 5 | 6 | 0 | 1 | 2 | 3 | 4 |
| | 3 | 4 | 5 | 6 | 0 | 1 | 2 | 3 |
| | 4 | 3 | 4 | 5 | 6 | 0 | 1 | 2 |
| | 5 | 2 | 3 | 4 | 5 | 6 | 0 | 1 |
| | 6 | 1 | 1 | 2 | 3 | 4 | 5 | 6 |

| c<br>fprr | | 0 | 1 | 2 | b<br>3 | 4 | 5 | 6 |
|---|---|---|---|---|---|---|---|---|
| | 0 | 0 | 6 | 5 | 4 | 3 | 2 | 1 |
| | 1 | 1 | 0 | 6 | 5 | 4 | 3 | 2 |
| a | 2 | 2 | 1 | 0 | 6 | 5 | 4 | 3 |
| | 3 | 3 | 2 | 1 | 0 | 6 | 5 | 4 |
| | 4 | 4 | 3 | 2 | 1 | 0 | 6 | 5 |
| | 5 | 5 | 4 | 3 | 2 | 1 | 0 | 6 |
| | 6 | 6 | 5 | 4 | 3 | 2 | 1 | 0 |

Error correcting decoding now comprises the following steps:

1. solve (with the minimum number of symbols) for each codeword with 2 assumed errors the necessary equations using the assumed error-free symbols to determine e1 and e2.
2. using the assumed error-free symbols and the resolved errors, determine the remaining symbols and thus the complete calculated codeword.
3. compare the calculated word with the received word.
4. the calculated word that has not less than 9 symbols (of 11) in common in corresponding positions with the received word is the correct word.

Resolving error word 1. [b5 b4 b3 b2 b1 a6 a5 a4 a3 e1 e2]

One can use the following equations (using the configuration of FIG. 1 of course):

$$b2=a6fpt1$$

$$t1=a5fpt2$$

$$t2=a4f3t3$$

$$t3=a3f4e1$$

This provides, by using the appropriate reversed functions:

$$t1=a6fprcb2$$

$$t2=a5fprct1$$

$$t3=a4f3rct2$$

$$e1=a3f4rct3$$

One can thus calculate e1.
For calculating e2 one can apply:

$$b1=a5fpt1$$

$$t1=a4fpt2$$

$$t2=a3f3t3$$

$$t3=e1f4e2$$

This provides:

$$t1=a5fprcb1$$

$$t2=a4fprct1$$

$$t3=a3f3rct2$$

$$e2=e1f4rct3 \text{ (as } e1 \text{ was already determined)}.$$

So e1 and e2, which presumably were in error, can be reconstructed from [b2 b1 a6 a5 a4 a3]. One can now generate the 11 symbol word based on the reconstructed e2 and e1. The method requires then that b3, b4 and b5 are calculated from [b2 b1 a6 a5 a4 a3]. One can do this by executing (in parallel if one wants to limit the number of cycles) the determining equations.

Resolving error word 1. [b5 b4 b3 b2 b1 a6 a5 a4 e1 e2 a1] The next step is to assume that a3 and a2 are in error and that [b3 b2 b1 a6 a5 a4] is error free. The process is a shifted version of resolving word 2.
The same applies for word 3 and word 4.

A slightly different approach is required for word 5 and word 6. For illustrative purposes word 6 will be resolved. Word 6 is: [b5 b4 b3 b2 e1 e2 a5 a4 a3 a2 a1] with b1 and a6 assumed to be in error. Applying the following equations (always using the configuration of FIG. 1)

$$t3=(a3f4a2)$$

$$t2=(a4f3t3)$$

$$t1=(a5fpt2)$$

$$e2=(b2fprrt1)$$

will resolve e2.
The following equations:

$$t3=(a4f4a3)$$

$$t2=(a5f4t3)$$

$$t1=(e2fpt2)$$

$$e1=(b3fprrt1)$$

will resolve e1.

The symbols b4 and b5 can be easily determined. The symbol a1 needs also to be determined from equations. The last item appears to be un-necessary because a1 is assumed to be correct. However assumption does not really make it so. In fact a1 may be in error. So perhaps a better way to articulate the error assumption is: it is assumed that at least 6 symbols are not in error. Careful selection of a set of not-in-error symbols may reduce the number of required equations. The following equations resolve a1:

$$t1=(a5fprce1)$$

$$t2=(a4fprct1)$$

$$t3=(a3f3rct2)$$

$$a1=(a2f4rct3)$$

This resolves a1.
There is a chance that the errors will have occurred in the configuration of word 7, word 8, word 9 and word 10. This means that [a6 a5 a4 a3 a2 a1] is error free. One should calculate the codeword based on this assumption also.

In fact by making assumptions on the distribution of the errors one can develop a calculation strategy that may increase the number of steps but could limit the number of to be executed equations. The assumption of [a6 a5 a4 a3 a2 a1] to be error free is part of such a strategy. These and other solving strategies are fully contemplated as an aspect of the present invention.

It should be clear that the here developed method can also be applied for error correction of non-adjacent errors.

One way to implement the error-correcting method is to have each possible error word resolved in parallel.

The following procedure listings in Matlab script provide an illustration of the here provided methods. It should be appreciated that other computer languages including SciLab, Visual Basic, C++, Java, can be used to describe the procedures and that Matlab is merely used as an illustrative example. Matlab has the advantage of being an engineering scripting language with very limited additional syntax statements, which makes it extremely simple to read. It should also be appreciated that the procedures are provided as an illustrative example of how methods of the present invention can be enabled. In the illustrative examples the focus is on clarity and readability of statements and not on optimized execution speed or economy of resources.

% Start Procedure $$y=a2a1(x) \text{ \% resolves word 1:}$$

$$b2=x(1);$$

$$b1=x(2);$$

$$a6=x(3);$$

$$a5=x(4);$$

$$a4=x(5);$$

$$a3=x(6);$$

$$t1=fprc(a6,b2);$$

$$t2=fprc(a5,t1);$$

$t3=f3rc(a4,t2);$ $e2=f4rc(a3,t3);$ $t1=fprc(a5,b1);$ $t2=fprc(a4,t1);$ $t3=f3rc(a3,t2);$ $e1=f4rc(e2,t3);$ % Calculate the Total Word init=[a6a5a4a3e1e2]

$y=lf76e11(\text{init});$

% End Procedure  
% Start Procedure $y=a3a2(x)$ % resolves word 2:

$b2=x(1);$ $b1=x(2);$ $a6=x(3);$ $a5=x(4);$ $a4=x(5);$ $a3=x(6);$ $t1=fprc(a6,b2);$ $t2=fprc(a5,t1);$ $t3=f3rc(a4,t2);$ $e2=f4rc(a3,t3);$ $t1=fprc(a5,b1);$ $t2=fprc(a4,t1);$ $t3=f3rc(a3,t2);$ $e1=f4rc(e2,t3);$ $t1=fprc(a4,a6);$ $t2=fprc(a3,t1);$ $t3=f3rc(e2,t2);$ $e0=f4rc(e1,t3);$ % Calculate the Total Word init=[a5a4a3e2e1e0]

$y=lf76e11(\text{init});$

% End Procedure  
% Start Procedure $y=a4a3(x)$ % resolves word 3:

$b2=x(1);$ $b1=x(2);$ $a6=x(3);$ $a5=x(4);$ $a4=x(5);$ $a3=x(6);$ $t1=fprc(a6,b2);$ $t2=fprc(a5,t1);$ $t3=f3rc(a4,t2);$ $e2=f4rc(a3,t3);$ $t1=fprc(a5,b1);$ $t2=fprc(a4,t1);$ $t3=f3rc(a3,t2);$ $e1=f4rc(e2,t3);$ $t1=fprc(a4,a6);$ $t2=fprc(a3,t1);$ $t3=f3rc(e2,t2);$ $e0=f4rc(e1,t3);$ $t1=fprc(a3,a5);$ $t2=fprc(e2,t1);$ $t3=f3rc(e1,t2);$ $e00=f4rc(e0,t3);$ % Calculate the Total Word init=[a4a3e2e1e0e00]

$y=lf76e11(\text{init});$

% End Procedure  
% Start Procedure $y=a5a4(x)$ % resolves word 4:

$b2=x(1);$ $b1=x(2);$ $a6=x(3);$ $a5=x(4);$ $a4=x(5);$ $a3=x(6);$ $t1=fprc(a6,b2);$ $t2=fprc(a5,t1);$ $t3=f3rc(a4,t2);$ $e2=f4rc(a3,t3);$ $t1=fprc(a5,b1);$ $t2=fprc(a4,t1);$ $t3=f3rc(a3,t2);$ $e1=f4rc(e2,t3);$ $t1=fprc(a4,a6);$ $t2=fprc(a3,t1);$ $t3=f3rc(e2,t2);$ $e0=f4rc(e1,t3);$ $t1=fprc(a3,a5);$ $t2=fprc(e2,t1);$ $t3=f3rc(e1,t2);$ $e00=f4rc(e0,t3);$ $t1=fprc(e2,a4);$ $t2=fprc(e1,t1);$ $t3=f3rc(e0,t2);$ $e000=f4rc(e00,t3);$ % Calculate the Total Word init=[a3e2e1e0e00e000]

$y=lf76e11(\text{init});$

% End Procedure
% Start Procedure $y=a6a5(x)$ % resolves word 5:

$b2=x(1);$ $b1=x(2);$ $a4=x(5);$ $a3=x(6);$ $a2=x(7);$ $a1=x(8);$ $t3=f4(a2,a1);$ $t2=f3(a3,t3);$ $t1=fp(a4,t2);$ $e5=fprr(b1,t1);$ $t3=f4(a3,a2);$ $t2=f3(a4,t3);$ $t1=fp(e5,t2);$ $e6=fprr(b2,t1);$ % Calculate the Total Word init=[e6e5a4a3a2a1]

$y=lf76e11(\text{init});$

% End Procedure
% Start Procedure $y=b1a6(x)$ % resolves word 6:

$b3=x(1);$ $b2=x(2);$ $a5=x(5);$ $a4=x(6);$ $a3=x(7);$ $a2=x(8);$ $t3=f4(a3,a2);$ $t2=f3(a4,t3);$ $t1=fp(a5,t2);$ $e6=fprr(b2,t1);$ $t3=f4(a4,a3);$ $t2=f3(a5,t3);$ $t1=fp(e6,t2);$ $eb1=fprr(b3,t1);$ $t1=fprc(a5,eb1);$ $t2=fprc(a4,t1);$ $t3=f3rc(a3,t2);$ $e1=f4rc(a2,t3);$ % Calculate the Total Word init=[e6a5a4a3a2e1]

$y=lf76e11(\text{init});$

% End Procedure
% Start Procedure $y=a6a1(x)$ % resolves word 7, 8, 9 and 10:

$a6=x(1);$ $a5=x(2);$ $a4=x(3);$ $a3=x(4);$ $a2=x(5);$ $a1=x(6);$

% Calculate the Total Word init=[a6a5a4a3a2a1]

$y=lf76e11(\text{init});$

% End Procedure

The individual processing units for calculating the codeword assuming that 2 adjacent symbols are in error can be combined to determine the corrected word. This is illustrated in a procedure of which the listing in Matlab script is provided next. In essence the procedure assumes different symbols to be in error and calculates the correct symbols based on the assumptions. It then compares the results with the received codeword. The calculated codeword with at least a certain number of symbols in common with the received codeword is selected as the correct codeword.

% Start Procedure function $y=\text{correcter}(x)$

% x is the Received Word nes=x(6:11);

r0=a6a1(nes);

p0=camel(x,r0);

nes=x(4:9);

r1=a2a1(nes);

p1=camel(x,r1);

nes=x(3:8);

r2=a3a2(nes)

p2=camel(x,r2);

nes=x(2:7);

r3=a4a3(nes);

p3=camel(x,r3);

nes=x(1:6);

r4=a5a4(nes);

p4=camel(x,r4);

nes=x(4:11);

r5=a6a5(nes);

p5=camel(x,r5);

nes=x(3:10);

r6=bla6(nes);

p6=camel(x,r6);

[p6 p5 p4 p3 p2 p1 p0]

% End of Procedure

The procedure camel(x,y) determines how many symbols sequences x and y have in common in corresponding positions.

The emphasis in the illustrative example is on clarifying the steps of the method which is an aspect of the present invention. In particular the emphasis is on the aspect of assuming that certain symbols are error free and based on this assumption by applying functions and their reversing functions in a deterministic way to articulate verifiable hypotheses about resulting codewords. One can then calculate all the hypotheses and check these against the received codeword (with potential errors).

Validation

The following results demonstrate and validate the here presented approach. Assume a correct 11 symbols 7-valued codeword:

tes=[2 0 5 4 6 5 2 2 6 3 0]

Assume that the received codeword has two errors: nes=[2 0 5 4 6 5 2 2 6 0 1]. Running the procedure will generate the comparison result: [6 6 9 9 9 9 7] of which the results with sum 9 all generate the correct word tes=[2 0 5 4 6 5 2 2 6 3 0].

Assume a correct 11 symbols 7-valued codeword: tes=[2 0 5 4 6 5 2 2 6 3 0]. Assume that the word has two errors: nes=[2 0 5 4 3 2 2 2 6 3 0]. Running the procedure will generate the comparison result: [9 6 7 6 7 6 6]. The results with sum 9 again generates the correct word tes=[2 0 5 4 6 5 2 2 6 3].

Assume a correct 11 symbols 7-valued codeword: tes=[2 0 5 4 6 5 2 2 6 3 0]. Assume that the word has two errors: nes=[1 1 5 4 6 5 2 2 6 3 0]. Running the procedure will generate the comparison result: [9 9 6 6 9 9 9] of which the results with sum 9 again generate the correct word tes=[2 0 5 4 6 5 2 2 6 3 0].

Non-adjacent Errors

For illustrative purposes it has been assumed that errors appear in a burst of consecutive errors. However it should be clear that non-adjacent errors can also be detected and corrected. For instance assume that the first (a1) and the last symbol (b5) in a codeword are in error. The received codeword can then be represented as [e5 b4 b3 b2 b1 a6 a5 a4 a3 a2 e1]. Earlier correcting methods (for instance the one that assumed that the first two symbols a1 and 2 are in error will also correct these non-adjacent errors. So the method of error correction applies to adjacent and non-adjacent errors. It also applies to correcting to more than 2 errors. This would require generating longer codewords.

Reduction of Number of Equations

Figures 3, 4:
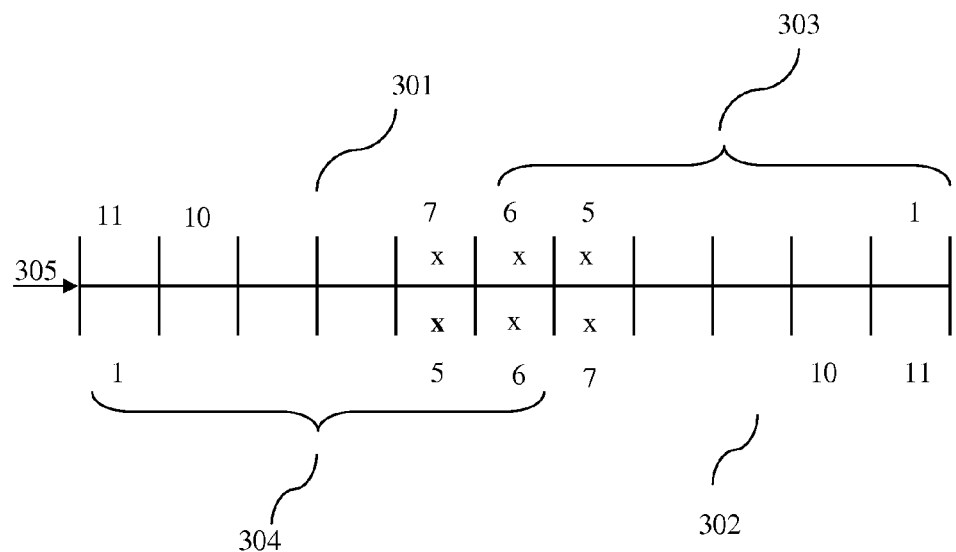
FIG. 3 is a diagram illustrating minimizing the number of error correcting equations.
FIG. 4 is another diagram illustrating minimizing the number of error correcting equations.

The illustrative example provided is intended to provide an exhaustive approach that addresses all two errors occurrences individually. Under the assumption that all errors are adjacent it is not necessary to calculate all individual error occurrences. FIG. 3 shows a diagram of an 11 symbol codeword with 6 information symbols generated by an LFSR as shown in FIG. 1. The diagram is such that the 11 elements above the line 305 show the position of the elements as they are being generated, being pushed from left to right. This means that the 6 information symbols are the 6 symbols 303. The symbols 7 to 11 above the line 305 are the remaining codeword symbols generated by the LFSR. The symbols are numbered in a reverse way under the line 305 in such a way that the last symbol in the codeword is called symbol 1 and the first symbol is called symbol 11. In the equations it was shown that when the first 6 symbols are known then the last 5 symbols can be generated. The reverse is also true: if the last 6 symbols are known the first 5 symbols can be derived.

Using the method that is one aspect of the present invention one can then use the first 6 symbols 303 of the codeword, determine the remaining 5 and compare the calculated codeword with the actual codeword. If the calculated codeword has 9 or more symbols in common with the actual codeword then 303 did not contain any errors. In that case one can stop further calculations, as 303 will be the correct information symbols. If the comparison provides fewer than 9 symbols in common than 303 contained at least one error.

One can obtain a similar result by recalculating the first 5 symbols from the last 6 symbols 304. If comparing the calculated codeword provides 9 or more symbols in common, then the 6 symbols 304 were error free and one can use the symbols numbered 5, 6 to 11 from the calculated codeword as the correct information symbols.

The situation needs to be addressed wherein both calculated words using 303 and 304 generate fewer than 9 symbols in common with the received codeword. This means that potentially symbols 5, 6 and 7 can be in error. Fortunately both situations were covered in the earlier developed methods. This means that rather than using the 7 equation sets one can reduce the error detection to 4 equation sets to be solved to achieve complete error correction of maximum 2 adjacent errors in the illustrative example. One can also reduce the last situation to a more complex equation set, wherein 3 unknowns are resolved, thus reducing the method to 3 equation sets.

As an illustrative example the following table shows potential adjacent 3-error situations in a 23 symbol codeword (formed from 16 information symbols and 7 overhead symbols).

```
23      20          16 15            10              5           1
          x  x  x
             x  x  x
                x  x  x
                                       x  x  x
                                    x  x  x
                                 x  x  x
1           5           10       15 16         20         23
```

One can use the above representation which is also shown in FIG. 4 to find a minimum number of equations to correct 3 adjacent errors. Such an approach is an extended repeat of the earlier provided method.

Structure and Value

The symbol reconstruction method here presented as an aspect of the present invention has a logic value independent aspect. The structure of the reconstruction formulas is independent of the applied n-valued logic. One may apply the structure for any n-valued logic as long as one complies with the following rules, also assuming that the LFSR generates words with the appropriate distance:

1. each n-valued code generator LFSR using a certain decoding structure applies the same length of codeword and generates words with similar distance independent of an n-valued logic;
2. each n-valued LFSR code generator uses the same and identified structure (such as in FIG. 1)
3. each applied n-valued logic function is reversible;

For illustrative purposes an 8-valued example will be provided. The structure of FIG. 1 will be applied, using the same length of LFSR and the same taps. The only difference is that all shift register elements can manage 8-valued symbols (or their binary representation) and all functions are 8-valued logic functions. It is not inherently sure that this configuration will work according to the conditions as stated before. Accordingly one has to find at least one set of 8-valued functions f1, f2, f3 and f4 that would work. In order for the 8-valued and 7-valued structure and their equations to be identical, the functions f1 and f2 should be identical. One way to create an 8-valued appropriate function is to use an 8-valued addition over GF($2^3$). Such functions are well documented in the known literature. The 8-valued addition function over GF($2^3$) that is used here is derived from the article "Reed-Solomon Codes" by Dr. Bernard Sklar that is available on the WWW at http://www.informit.com/content/images/art_sklar7_reed-solomon/elementLinks/art_sklar7_reed-solomon.pdf and is incorporated herein by reference. The addition table that is applied is provided on page 16 of the Sklar article.

The following truth tables describe the 8-valued functions fp, fprr, fprc, f3, f3rr, f3rc, f4, f4rr and f4rc.

|   |   |   |   |   | b |   |   |   |   |
|---|----|---|---|---|---|---|---|---|---|
|   | fp | 0 | 1 | 2 | 3 | 4 | 5 | 6 | 7 |
|   | 0  | 0 | 1 | 2 | 3 | 4 | 5 | 6 | 7 |
|   | 1  | 1 | 0 | 4 | 7 | 2 | 6 | 5 | 3 |
| a | 2  | 2 | 4 | 0 | 5 | 1 | 3 | 7 | 6 |
|   | 3  | 3 | 7 | 5 | 0 | 6 | 2 | 4 | 1 |
|   | 4  | 4 | 2 | 1 | 6 | 0 | 7 | 3 | 5 |
|   | 5  | 5 | 6 | 3 | 2 | 7 | 0 | 1 | 4 |
|   | 6  | 6 | 5 | 7 | 4 | 3 | 1 | 0 | 2 |
|   | 7  | 7 | 3 | 6 | 1 | 5 | 4 | 2 | 0 |

It turns out that this 8-valued fp is self reversing. This means that fprr=fp and fprc=fp. For f4, f4rr and f4rc the following tables apply:

| f4 | 0 | 1 | 2 | 3 | 4 | 5 | 6 | 7 |
|----|---|---|---|---|---|---|---|---|
| 0 | 0 | 3 | 4 | 5 | 6 | 7 | 1 | 2 |
| 1 | 2 | 5 | 1 | 3 | 7 | 6 | 4 | 0 |
| 2 | 3 | 0 | 6 | 2 | 4 | 1 | 7 | 5 |
| 3 | 4 | 6 | 0 | 7 | 3 | 5 | 2 | 1 |
| 4 | 5 | 2 | 7 | 0 | 1 | 4 | 6 | 3 |
| 5 | 6 | 4 | 3 | 1 | 0 | 2 | 5 | 7 |
| 6 | 7 | 1 | 5 | 4 | 2 | 0 | 3 | 6 |
| 7 | 1 | 7 | 2 | 6 | 5 | 3 | 0 | 4 |

| f4rr | 0 | 1 | 2 | 3 | 4 | 5 | 6 | 7 |
|------|---|---|---|---|---|---|---|---|
| 0 | 0 | 2 | 3 | 4 | 5 | 6 | 7 | 1 |
| 1 | 7 | 6 | 1 | 5 | 4 | 2 | 0 | 3 |
| 2 | 1 | 4 | 7 | 2 | 6 | 5 | 3 | 0 |
| 3 | 2 | 0 | 5 | 1 | 3 | 7 | 6 | 4 |
| 4 | 3 | 5 | 0 | 6 | 2 | 4 | 1 | 7 |
| 5 | 4 | 1 | 6 | 0 | 7 | 3 | 5 | 2 |
| 6 | 5 | 3 | 2 | 7 | 0 | 1 | 4 | 6 |
| 7 | 6 | 7 | 4 | 3 | 1 | 0 | 2 | 5 |

| f4rc | 0 | 1 | 2 | 3 | 4 | 5 | 6 | 7 |
|------|---|---|---|---|---|---|---|---|
| 0 | 0 | 6 | 7 | 1 | 2 | 3 | 4 | 5 |
| 1 | 7 | 2 | 0 | 3 | 6 | 1 | 5 | 4 |
| 2 | 1 | 5 | 3 | 0 | 4 | 7 | 2 | 6 |
| 3 | 2 | 7 | 6 | 4 | 0 | 5 | 1 | 3 |
| 4 | 3 | 4 | 1 | 7 | 5 | 0 | 6 | 2 |
| 5 | 4 | 3 | 5 | 2 | 1 | 6 | 0 | 7 |
| 6 | 5 | 1 | 4 | 6 | 3 | 2 | 7 | 0 |
| 7 | 6 | 0 | 2 | 5 | 7 | 4 | 3 | 1 |

For f3, f3rr and f3rc the following tables apply

| f3 | 0 | 1 | 2 | 3 | 4 | 5 | 6 | 7 |
|----|---|---|---|---|---|---|---|---|
| 0 | 0 | 1 | 2 | 3 | 4 | 5 | 6 | 7 |
| 1 | 5 | 6 | 3 | 2 | 7 | 0 | 1 | 4 |
| 2 | 6 | 5 | 7 | 4 | 3 | 1 | 0 | 2 |
| 3 | 7 | 3 | 6 | 1 | 5 | 4 | 2 | 0 |
| 4 | 1 | 0 | 4 | 7 | 2 | 6 | 5 | 3 |
| 5 | 2 | 4 | 0 | 5 | 1 | 3 | 7 | 6 |
| 6 | 3 | 7 | 5 | 0 | 6 | 2 | 4 | 1 |
| 7 | 4 | 2 | 1 | 6 | 0 | 7 | 3 | 5 |

| f3rr | 0 | 1 | 2 | 3 | 4 | 5 | 6 | 7 |
|------|---|---|---|---|---|---|---|---|
| 0 | 0 | 4 | 5 | 6 | 7 | 1 | 2 | 3 |
| 1 | 4 | 0 | 7 | 3 | 5 | 2 | 1 | 6 |
| 2 | 5 | 7 | 0 | 1 | 4 | 6 | 3 | 2 |
| 3 | 6 | 3 | 1 | 0 | 2 | 5 | 7 | 4 |
| 4 | 7 | 5 | 4 | 2 | 0 | 3 | 6 | 1 |
| 5 | 1 | 2 | 6 | 5 | 3 | 0 | 4 | 7 |
| 6 | 2 | 1 | 3 | 7 | 6 | 4 | 0 | 5 |
| 7 | 3 | 6 | 2 | 4 | 1 | 7 | 5 | 0 |

| f3rc | 0 | 1 | 2 | 3 | 4 | 5 | 6 | 7 |
|------|---|---|---|---|---|---|---|---|
| 0 | 0 | 1 | 2 | 3 | 4 | 5 | 6 | 7 |
| 1 | 5 | 6 | 3 | 2 | 7 | 0 | 1 | 4 |
| 2 | 6 | 5 | 7 | 4 | 3 | 1 | 0 | 2 |
| 3 | 7 | 3 | 6 | 1 | 5 | 4 | 2 | 0 |
| 4 | 1 | 0 | 4 | 7 | 2 | 6 | 5 | 3 |
| 5 | 2 | 4 | 0 | 5 | 1 | 3 | 7 | 6 |

| 6 | 3 | 7 | 5 | 0 | 6 | 2 | 4 | 1 |
| 7 | 4 | 2 | 1 | 6 | 0 | 7 | 3 | 5 |

One can check in the above equations by replacing the 7-valued functions by the appropriate 8-valued functions that the same error correcting methods apply. Two consecutive 8-valued symbol errors translate into maximal 6 adjacent binary errors. There is no real increase in required calculating time or computer power for error correction. If one executes the functions in binary form there is a greater requirement for storage space. The extra effort is mainly in upfront determining the correct functions. By finding correct 16-valued functions one can increase the error correction to (in the example) error correction of up to 8 consecutive bits out of 44 bits.

The 8-valued function fp is an adder over GF(8). This function is self-reversing, associative and distributive with multipliers over GF(8). In such a case solving the equations using the multipliers may be quite easy. The 8-valued function f4 is identical to the function fp with multipliers 2 and 3 at its input as shown in diagram FIG. 5. The 8-valued function f3 is identical to fp with a multiplier 5 at its input. The multiplication is also defined over GF(8). The truth table of the multiplication m8 over GF(8) is provided in the following truth table.

| c | | | | | b | | | | |
|---|---|---|---|---|---|---|---|---|---|
| | fp | 0 | 1 | 2 | 3 | 4 | 5 | 6 | 7 |
| | 0 | 0 | 0 | 0 | 0 | 0 | 0 | 0 | 0 |
| | 1 | 0 | 1 | 2 | 3 | 4 | 5 | 6 | 7 |
| a | 2 | 0 | 2 | 3 | 4 | 5 | 6 | 7 | 1 |
| | 3 | 0 | 3 | 4 | 5 | 6 | 7 | 1 | 2 |
| | 4 | 0 | 4 | 5 | 6 | 7 | 1 | 2 | 3 |
| | 5 | 0 | 5 | 6 | 7 | 1 | 2 | 3 | 4 |
| | 6 | 0 | 6 | 7 | 1 | 2 | 3 | 4 | 5 |
| | 7 | 0 | 7 | 1 | 2 | 3 | 4 | 5 | 6 |

The advantage of the multiplier that the inverse of a multiplication (which one may call a division) is easy to establish. The inverse of multiplier 1 is itself. The inverse of multiplication by 2 is multiplication by 7; the inverse of multiplication by 3 is multiplication by 6; the inverse of multiplication by 4 is multiplication by 5.

Figure 5:
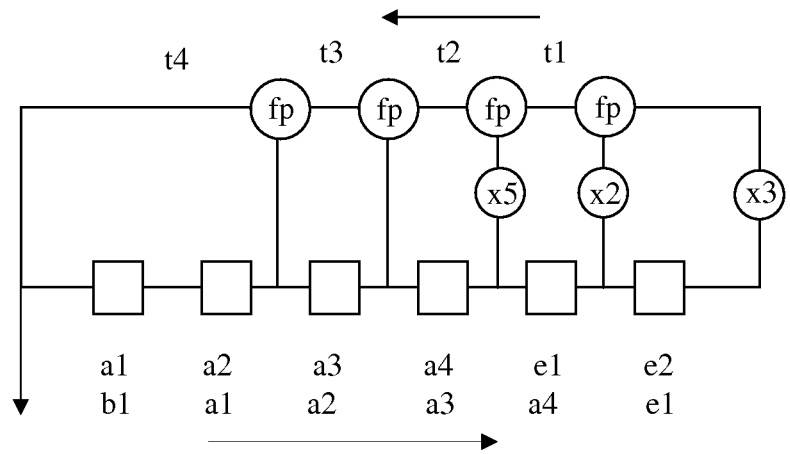
FIG. 5 is a diagram of a Fibonacci configuration coder with two consecutive states of a shift register.

As an illustrative example of using FIG. 5 two adjacent errors $e_1$ $e_2$ will be resolved occurring in 8-valued codeword [b5 b4 b3 b2 b1 a6 a5 a4 a3 a2 a1] wherein a2 and a1 are assumed to be in error. The two consecutive states of the shift register are shown in FIG. 5. These states are [a6 a5 a4 a3 e2 e1] and [b1 a6 a5 a4 a3 e2]. The second state generates b2 and thus has one unknown e2. Once e2 is solved e1 can be determined. At any state the functions will generate intermediate results t1, t2, t3 and t4. The result t4 will be outputted and inputted into the shift register.

The equations for the second state are:

$t1=2a4+3e1$ $t2=5a3+t1$ $t3=a2+t2$ $t4=a1+t3$ $t4=b2$

The function '+' is fp and is self reversing. Further more $a+a=0$.

Accordingly:

$3e1=2a4+t1$ $t1=5a3+t2$ $t2=a2+t3$ $t3=a1+t4$ $t4=b2$

Thus: $3e1=2a4+5a3+a2+a1+b2$ and: $e1=6(2a4+5a3+a2+a1+b2)$ or $e1=7a4+3a3+6a2+6a1+6b2$.

From the first state one can derive:

$t1=2e1+3e2$ $t2=5a4+t1$ $t3=a3+t2$ $t4=a2+t3$ $t4=b1$, thus:

$3e2=2e1+5a4+a3+a2+b1$; this will lead to $e2=7e1+3a4+6a3+6a2+6b1$.

As an illustrative example one can use a codeword [b5 b4 b3 b2 b1 a1 a2 a3 a4 a5 a6]=[7 2 1 5 3 0 1 2 3 4 5]. Assume that the last two digits were in error, and for instance the word [7 2 1 5 3 0 1 2 3 1 0] was received. The above equations will provide [e1 e2]=[4 5]. Comparing the corrected codeword with the received codeword will provide 9 symbols in common, which indicates that the correction is correct.

The example shows that the method works. It also shows that one could correct the word in error if other symbols were in error. Only 6 correct symbols are required to reconstruct the received codeword. However it is not possible to check if the correct codeword was reconstructed if more than 2 symbols in the example were in error.

It is an aspect of the present invention to provide the method of the correction window. Rather than, as in the example, to assume symbols in error, it is possible to assume a series of correct symbols. Those symbols may be consecutive; they may also be non-adjacent. The symbols assumed to be correct then fall inside the correct window. The symbol outside the correct window fall in the correction window. Implied in the assumption should be that no more than t symbols in error occur in the correction window of the codeword. If the distance between (p,k) codewords is (p−k)=2*t+1 then t errors can be corrected.

It should be clear that one can apply the here presented method to any (p,k) error correcting code. The steps for creating codewords include finding the correct LFSR with a k elements shift register configuration and functions which can create an extended pseudo-noise sequence. One should then create $(n^k-1)$ words of p n-valued symbols, each codeword having at most k symbols in common with any other codeword. Furthermore the distance between codewords is at least (n−k). This condition excludes RS-codes wherein the distance between codewords is at least (n−k+1). However RS-codes limit the size of codewords in relation to the value n of the symbols. One may create a codeword in Fibonacci configuration or in Galois configuration. In Fibonacci configuration one initializes the LFSR with the information word and then runs the LFSR for (p−k) clock cycles. In the Galois configuration the LFSR is initialized by entering a sequence of k n-valued symbols into an LFSR of length (p−k). After entering the k symbols the (p−k) symbols in the shift register will form check symbols. The next step is to construct the reversing equations between assumed correct symbols and assumed to be in error symbols. One should solve the equations for the different assumptions and select one of the solved codewords which will has at least (p−t) symbols in common with the codeword in error, assuming that the codeword has t errors. While the solution may be resource intensive, it is also very fast. Further more this method has not the strict limitations which are imposed by RS-codes.

The methods of error correction can be easily implemented in general microprocessors or signal processors. The individual steps can also be realized as dedicated switching circuits such as Programmable Arrays or Look-up Table methods. For smaller values of n in n-valued numbers one can apply dedicated n-valued switching devices. For large values of n one can also apply binary coded or represented n-valued symbols and apply binary coded n-valued truth tables.

Figure 6:
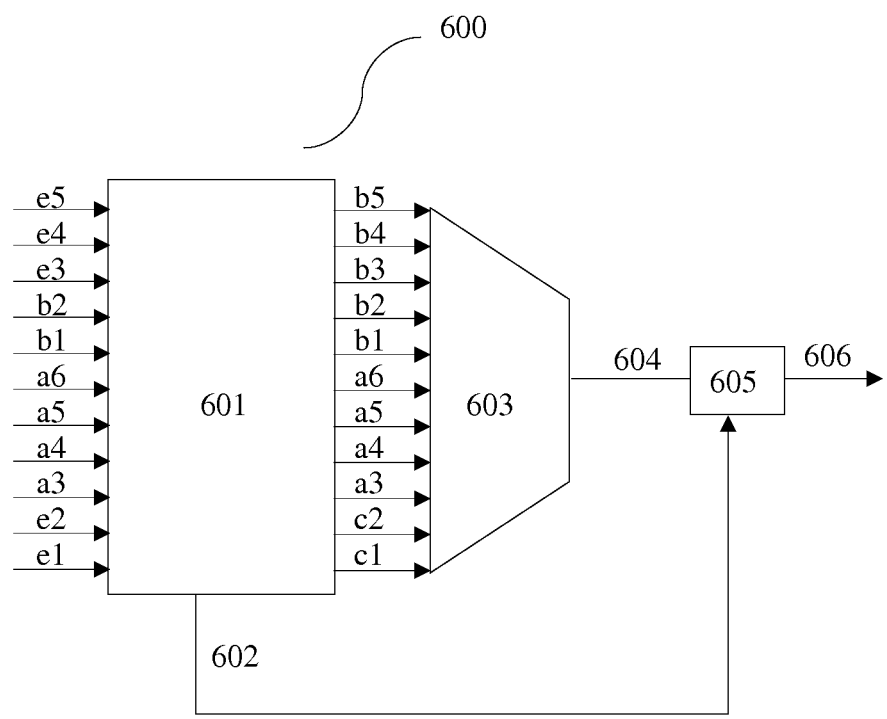
FIG. 6 is a block diagram of a device executing non-iteratively an n-valued expression for generating a calculated codeword and comparing the calculated codeword with a received codeword.

FIG. 6 shows an example of an embodiment of part of a decoder. A codeword, potentially after deserializing, is presented in parallel form as n-valued symbols [b5 b4 b3 b2 b1 a1 a2 a3 a4 a5 a6] based on an 11 n-valued symbols codeword to a first decoder 600. The decoder 600 in a unit 601 which may solve the codeword under the assumption that only 2 symbols of the 11 are in error and that for instance [b2 b1 a1 a2 a3 a4] is not in error. The inputted codeword in error is represented as [e5 e4 e3 b2 b1 a1 a2 a3 e2 e1]. It is to be understood that only 2 of the symbols [e5 e4 e3 e2 e1] may actually be in error. As output the corrected codeword [b5 b4 b3 b2 b1 a1 a2 a3 a4 a5 a6] may be outputted. One may also at this stage strip [b5 b4 b3 b2 b1] from the codeword as only [a1 a2 a3 a4 a5 a6] is of actual interest. On output 602 also a signal representing the number of symbols which the inputted and calculated codeword have in common are outputted to a gate 605. The symbols which are outputted by the unit 601 may be serialized by a multiplexer 603 and also outputted to the gate 605 as a serialized word 604. The gate 605 may output the serialized correct codeword on output 606 when the signal on 602 meets certain conditions. For instance when it indicates in the illustrative examples that the calculated word of 11 symbols and the inputted word of symbols have at least 9 symbols in common.

Figure 7:
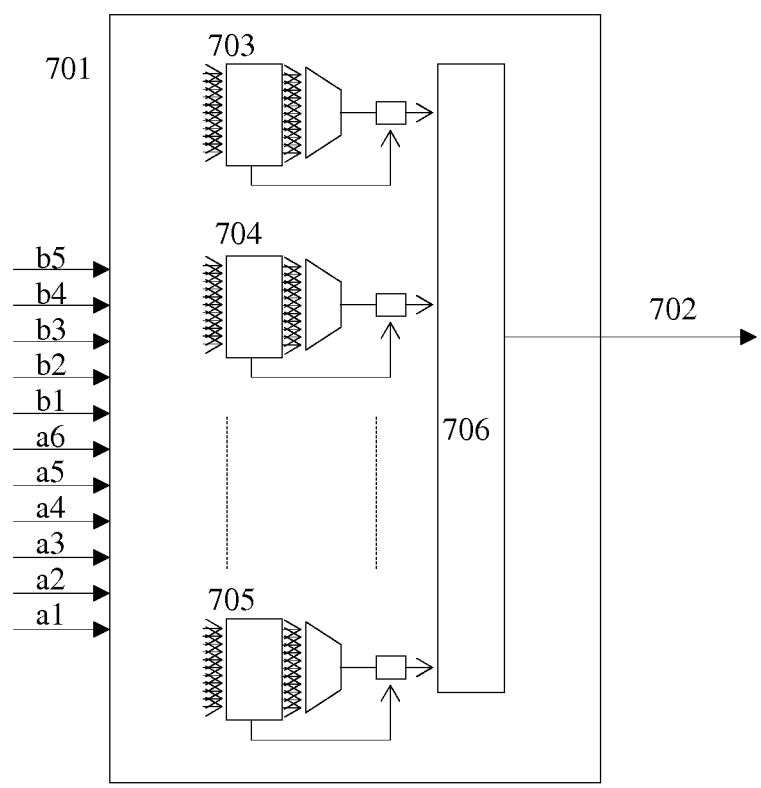
FIG. 7 is a block diagram of a system executing in parallel non-iteratively n-valued expressions and providing an error corrected codeword.

FIG. 7 shows a diagram of a complete error correcting decoder 701 with a number of individual decoding units 703, 704 to 705. Each of the individual decoding units calculates a correct codeword based on different error assumptions. The results of the individual decoding unit are provided to a decision circuit 706. Each decoding unit may for instance output a non-occurring codeword to decision circuit 706 if such a unit does not generate a signal indicating sufficient common symbols between incoming and calculated codeword. The decision unit 706 may select as the codeword that is correct and outputted on 702 the codeword generated by the decoding unit closest to the top that does not generate a non-occurring codeword. Accordingly a decoding system is provided that uses a codeword with symbols in error and generates a corrected codeword. It is to be understood that one may drop the calculated check symbols and uses for instance a calculated information word from the decoding unit closest to the top that generates a signal indicating that a valid codeword was generated. Other embodiments of detection and decoding are possible and fully contemplated.

Galois Configurations

Aspects of the present invention have been explained in the context of Fibonacci configuration LFSRs. It is also possible to apply Galois configuration LFSRs.

Figure 8:
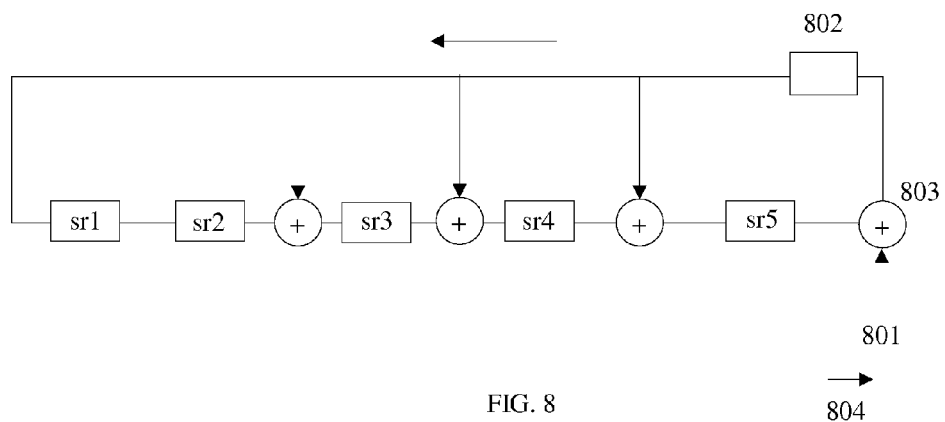
FIG. 8 is an 8-valued coder in Galois configuration in accordance with an aspect of the present invention.

In a first embodiment one can apply Galois configuration LFSRs as coders which are equivalent to the Fibonacci configuration. One such equivalent coder is shown in FIG. 8. The + is the earlier provided 8-valued adder over GF(8). The coder works almost as an RS coder. On input 801 for instance 6 8-valued information symbols are provided. The initial content of the 5 element 8-valued shift register with elements sr1, sr2, sr3, sr4 and sr5 is [0 0 0 0 0]. The gate 802 is in a conducting state and passes all symbols outputted by adder 803. The circuit, as usual for an LFSR based circuit, is under control of a clock signal which is assumed present, but not shown.

After 6 clock pulses and entering all 6 information symbols into the coder, the check symbols are now the symbols in the shift register elements. The 8-valued codeword is then formed by the 6 information symbols a1, a2, a3, a4, a5 and a6 and the content of the shift register, for instance sr1=b1, sr2=b2, sr3=b3, sr4=b4 and sr5 b5. The codeword is [a1 a2 a3 a4 a5 a6 b1 b2 b3 b4 b5]. One may shift the check symbols out of the shift register by for instance opening gate 802 (which may make the output of the gate 0) and shift the content of the shift register out on output 804.

One can check that all possible codewords [a1 a2 a3 a4 a5 a6 b1 b2 b3 b4 b5] generated by this coder by using all possible 8-valued information words [a1 a2 a3 a4 a5 a6] have at least 5 symbols difference in corresponding positions. Accordingly 2 symbols in error may be corrected. The coder creates thus codewords that have one symbol more in common than the RS coder of this structure.

The relationship between the generated check symbols [b1 b2 b3 b4 b5] and the inputted information symbols are:

$$b1=a2+a5+a6$$

$$b2=a1+a4+a5$$

$$b3=a2+a3+a4+a5+a6$$

$$b4=a1+a3+a4+a6$$

$$b5=a3+a6$$

Herein + is the 8-valued adder over GF(8).

As an example one can take the information word [a1 a2 a3 a4 a5 a6]=[2 4 0 5 1 6] which will through the coder of FIG. 8 generate codeword=[2 4 0 5 1 6 7 7 4 4 6]. For instance assume a1 and a6 to be in error. From the above equations one can determine: a1=b2+a4+a5 and a6=b5+a3. This will lead to a1=2 and a6=6.

Accordingly the methods as explained in detail for Fibonacci coders can also be applied to equivalent Galois coders.

In accordance with a further aspect of the present invention a method of error correction is provided that is independent of the determination of the position of the errors. As a novel method of error correction herein a method was provided for making an assumption of occurrence of errors. However there are different methods of determining error locations. For instance a codeword may have additional check symbols that determine the location of errors. A codeword may be part of a plurality of codewords, wherein a codeword in error determines an error location. One may also solve error locations by determining an error location polynomial as is known in the art of error control and for instance described in the earlier cited book of Lin and Costello.

For instance assume that in the method of error correction of FIG. 8 it was determined that symbol 1 and 7 (or a1 and b1) were in error. Symbol b1 is a check symbol, and may not really need to be determined. However a1 is required. One can then directly determine from a1=b2+a4+a5 what the correct value of a1 should be. In present day methods for Reed Solomon error correcting coding one determines the correct value of a symbol by an iterative process that is: run a syndrome calculation for a symbol in error until the syndrome yields for instance a 0. Accordingly one can now determine the correct value of a symbol directly once the position is known. This was previously only possible in the binary case. If a binary symbol was found in error or one has to do is invert (or flip) the value of the binary symbol in error.

A BINARY EXAMPLE

Figure 9:
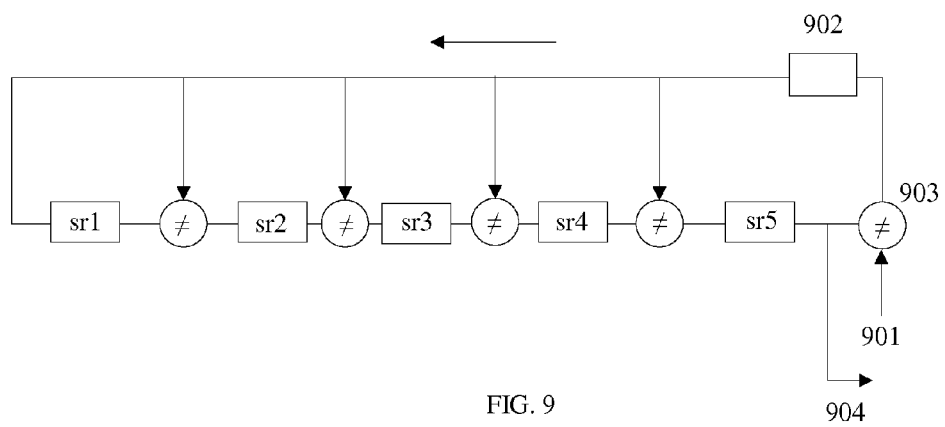
FIG. 9 is a binary coder in Galois configuration in accordance with an aspect of the present invention.

It is possible to apply the methods provided herein also to binary error correcting codes. An example is shown in FIG. 9. FIG. 9 shows a binary Galois LFSR based coder. A clock signal is assumed but not shown. The initial state of the LFSR is [0 0 0 0 0]. At input 901 8 binary information bits are provided during 8 clock pulses and shifted into the LFSR through XOR gate 903. The content of the 5 element shift register after entering the 8 information bits will be the 5 check bits. The check bit may be shifted out of the shift register by making gate 902 non-conducting so that the gate produces only 0s and the content of the shift register is not changed. The check bits are outputted on output 904. The codeword is then formed by the 8 information bits and the 5 check bits. Each of the 256 codewords of 13 bits that can be created in this way has at most 8 bits in common in like positions which each other codeword that can be created with this coder. Accordingly one may correct the binary codeword by:
1. detecting if a binary codeword has errors
2. if so make an assumption on which bit are in error or are not in error
3. create a calculated codeword
4. compare the calculated codeword with the received codeword
5. accept the calculated codeword as the correct codeword if there are no more than 2 symbols in difference.

Accordingly the method of error correction which is an aspect of the present invention is non-iterative. One does not have to execute a series of syndrome equations to detect a correct symbol once its position is known. All steps in the present invention are deterministic. The advantage is the speed of execution and the circumvention of iterative procedures.

There is a very wide field of application in error correcting coding, and especially in binary coded n-valued symbols. Aspects of the present invention can easily be applied in these areas, such as wireless and wired communication and in areas such as storage of data such as optical disks. In a first system the methods and system of error correction can be used in a communication system with a transmitter and a receiver. The system can be a wired communication system, using electrical, optical or any other electromagnetic signal. The system can also be wireless, generating and receiving radio, infrared, laser or any other electromagnetic signal that is not guided by a wire, a fiber or any other waveguide. The system can be a cell-phone system, a wireless computer network, WiFi, WiMax or any other wireless or wired system. The system can also be applied for RFID or barcode applications. Furthermore the system using the methods or system with aspects of the present invention can also be a storage system, including for storing and retrieving or playing of data, music, voice, video or any other multi-media data. The methods herein disclosed can be embedded in a chip as part of a system, used as a set of instructions on a processor, stored for execution in a dedicated chip or circuit, or provided as a set of individual chips or any other form that allows implementations of the methods and the creation of a system.

While there have been shown, described and pointed out fundamental novel features of the invention as applied to preferred embodiments thereof, it will be understood that various omissions and substitutions and changes in the form and details of the device illustrated and in its operation may be made by those skilled in the art without departing from the spirit of the invention. It is the intention, therefore, to be limited only as indicated by the scope of the claims appended hereto.

The invention claimed is:

1. A method for error correction decoding, comprising:
a processing circuit receiving a plurality of signals representing a codeword of a cyclic code with a fixed length with a minimum distance between codewords determined by an n-valued shift register based coder prior to transmission, the received codeword consisting of p n-valued symbols with n greater than 2 of which k n-valued symbols are information symbols and (p−k) n-valued symbols are check symbols with p>1 and k>1 and p>k, each n-valued check symbol is determined prior to transmission by an n-valued logic expression, which is not a polynomial expression of a degree greater than 1, with at least two n-valued information symbols as variables and wherein at least one n-valued symbol of the received codeword is in error; and wherein the n-valued logic expression is determined by the shift register based coder;
the processing circuit determining an n-valued check symbol from the received k n-valued information symbols that indicates that an error has occurred in the received codeword;
the processing circuit generating non-iteratively in a deterministic manner a plurality of calculated codewords from the received codeword, each calculated codeword in the plurality of calculated codewords being associated with the n-valued shift register based coder and including a calculated n-valued symbol, and wherein
a value of the calculated n-valued symbol in each of the calculated codewords is generated by the processing circuit evaluating a pre-determined n-valued logic expression that outputs the value, the predetermined n-valued expression is associated with a location of the calculated symbol in a calculated codeword in which it is calculated;
the processing circuit selecting one of the plurality of calculated codewords as a correct codeword and providing at least one corrected symbol of the one of the plurality of calculated codewords on an output of the device, wherein the device is part of the group consisting of communication apparatus, data storage apparatus, and medium display apparatus; and,
determining a correctness of at least one calculated codeword by comparing it to the received codeword and adding to a score when an n-valued symbol in the at least one calculated codeword is identical to an n-valued symbol in a corresponding position in the received codeword.

2. The method as claimed in claim 1, further comprising determining a correctness of at least one calculated codeword by comparing it to the received codeword and adding to a score when an n-valued symbol in the at least one calculated codeword is identical to an n-valued symbol in a corresponding position in the received codeword.

3. The method as claimed in claim 1, wherein p>n.

4. The method as claimed in claim 1, wherein up to t errors can be corrected in the codeword of p n-valued symbols and k information symbols when 2*t+1=(p−k).

5. The method as claimed in claim 1, wherein the received codeword has no more than k symbols in k positions in common with k symbols in like positions in any calculated codeword in the plurality of calculated codewords.

6. The method as claimed in claim 1, wherein the shift register based coder is configured to generate a pseudo-noise sequence of n-valued symbols.

7. The method as claimed in claim 1, wherein the check symbols are generated by a Linear Feedback Shift Register (LFSR) in Galois configuration that is configured to generate a pseudo-noise sequence of n-valued symbols.

8. The method as claimed in claim 1, wherein the predetermined n-valued logic expression reflects a plurality of symbols assumed to be not in error in the codeword.

9. The method as claimed in claim 1, wherein an n-valued symbol is represented by binary symbols.

10. The method as claimed in claim 1, wherein the n-valued logic expressions do not include a magnitude of error as input variable.

11. The method of claim 1, wherein the codeword determined by an n-valued shift register based coder is a Bose-Chaudhuri-Hocquenchem (BCH) codeword.

12. An apparatus to error correction decode a codeword of symbols represented by a plurality of signals, comprising:
a receiver, enabled to receive the plurality of signals;
a processing circuit, enabled to process the plurality of signals representing the codeword of a cyclic code with a fixed length with a minimum distance between codewords determined by an n-valued shift register based coder prior to transmission, the codeword consisting of p n-valued symbols with n greater than 2 of which k n-valued symbols are information symbols and (p−k) n-valued symbols are check symbols with p>1 and k>1 and p>k, each n-valued check symbol is determined prior to transmission by an n-valued logic expression, which is not a polynomial expression of a degree greater than 1, with at least two n-valued information symbols as variables and wherein at least one n-valued symbol of the received codeword is in error, and wherein the n-valued logic expression is determined by the shift register based coder;
the processing circuit configured to determine an n-valued check symbol from the received k n-valued information symbols that indicates that an error has occurred in the received codeword;
the processing circuit configured to generate non-iteratively in a deterministic manner a plurality of calculated codewords from the received codeword, each calculated codeword in the plurality of calculated codewords being associated with the n-valued shift register based coder and including a calculated n-valued symbol,
the processing circuit configured to generate a value of the calculated n-valued symbol in each of the calculated codewords by evaluating a pre-determined n-valued logic expression which is associated with a location of the calculated symbol in a calculated codeword in which it is calculated;
an output configured to output the value;
the processing circuit configured to select one of the plurality of calculated codewords as a correct codeword;
an output of the device to provide at least one corrected symbol of the one of the plurality of calculated codewords, wherein the device is part of the group consisting of communication apparatus, data storage apparatus, and medium display apparatus; and,
the processing circuit configured to determine a correctness of at least one calculated codeword by comparing it to the received codeword and adding to a score when an n-valued symbol in the at least one calculated codeword is identical to an n-valued symbol in a corresponding position in the received codeword.

13. The apparatus of claim 12, wherein the n-valued shift register based coder has a Fibonacci configuration.

14. The apparatus of claim 12, wherein the n-valued shift register based coder is a pseudo-noise sequence generator.

* * * * *